United States Patent
Belt et al.

(10) Patent No.: US 6,677,755 B2
(45) Date of Patent: Jan. 13, 2004

(54) CIRCUIT FOR SELECTIVELY ENABLING AND DISABLING COILS OF A MULTI-COIL ARRAY

(75) Inventors: Kenneth W. Belt, Fort Atkinson, WI (US); Michael Reichel, Pittsburgh, PA (US); J. Michael Watral, Stow, PA (US); Stanley R. Lewandowski, Cheswick, PA (US); Bradley J. Adams, West Leechburg, PA (US); Lisa A. Augustine, Natrona Heights, PA (US); Robert S. Bell, Jr., Pittsburgh, PA (US)

(73) Assignee: Medrad, Inc., Indianola, PA (US)

( * ) Notice: Subject to any disclaimer, the term of this patent is extended or adjusted under 35 U.S.C. 154(b) by 0 days.

(21) Appl. No.: 10/260,787

(22) Filed: Sep. 30, 2002

(65) Prior Publication Data

US 2003/0117140 A1 Jun. 26, 2003

Related U.S. Application Data

(62) Division of application No. 10/015,190, filed on Nov. 26, 2001, which is a division of application No. 08/978,718, filed on Nov. 26, 1997, now Pat. No. 6,323,648.

(51) Int. Cl.$^7$ ................................................. G01V 3/00
(52) U.S. Cl. ........................................ 324/322; 324/318
(58) Field of Search ............................... 324/322, 318, 324/314, 300, 306, 307, 309, 312; 600/420, 421, 422, 410

(56) References Cited

U.S. PATENT DOCUMENTS

| | | |
|---|---|---|
| 4,718,424 A | 1/1988 | Nishimura |
| 4,721,913 A | 1/1988 | Hyde et al. |
| 4,825,162 A | 4/1989 | Roemer et al. |
| 4,975,644 A | 12/1990 | Fox |
| 5,034,694 A | 7/1991 | Sattin et al. |

(List continued on next page.)

FOREIGN PATENT DOCUMENTS

| | | |
|---|---|---|
| DE | 197 09 244 | 6/1998 |
| EP | 390 476 | 10/1990 |
| EP | 758 091 | 2/1997 |
| EP | 803 736 | 10/1997 |

OTHER PUBLICATIONS

Roemer, et al., The NMR Phased Array, Magnetic Resonance in Medicine 16, pp. 192–255, (1990).
Medical Advances, Peripheral Vascular Coil, promotional brochure (Apr. 1997).
Kojima, K. Y., et al., "Lower Extremities: MR Angiography with a Unilateral Telescopic Phased–Array Coli," Radiology, vol. 196: pp. 871–875 (1995).

(List continued on next page.)

Primary Examiner—Louis Arana
(74) Attorney, Agent, or Firm—James R. Stevenson

(57) ABSTRACT

A circuit for selectively disabling and enabling n-coils includes n-drivers disposed in a totem-pole configuration. Each of the n-drivers includes two FETs whose gates connect at a common node therefor. Each n-driver is used to operate one of the n-coils by being responsive at its common node to (i) a coil disable signal by activating one FET thereof and deactivating the other FET thereof drawing current away from and thus disabling its corresponding coil and allowing current to flow through the one FET and thus be available as a source of current to a successive one of the n-drivers and (ii) a coil enable signal by deactivating the one FET thereof and activating the other FET thereof thereby allowing current to flow serially through its corresponding coil and the other FET thus enabling its corresponding coil and to be available as a source of current to the successive n-driver.

16 Claims, 29 Drawing Sheets

U.S. PATENT DOCUMENTS

| | | | |
|---|---|---|---|
| 5,132,621 A | 7/1992 | Kang et al. | |
| 5,167,232 A | 12/1992 | Parker et al. | |
| 5,168,230 A | 12/1992 | Hashoian et al. | |
| 5,196,796 A | 3/1993 | Misic et al. | |
| 5,216,367 A | 6/1993 | Mori | |
| 5,258,717 A | 11/1993 | Misic et al. | |
| 5,363,845 A | 11/1994 | Chowdbury et al. | |
| 5,417,213 A | 5/1995 | Prince | |
| 5,430,378 A | 7/1995 | Jones | |
| 5,432,449 A | 7/1995 | Ferut et al. | |
| 5,471,142 A | 11/1995 | Wang | |
| 5,477,146 A | 12/1995 | Jones | |
| 5,517,120 A | 5/1996 | Misic et al. | |
| 5,521,506 A | 5/1996 | Misic et al. | |
| 5,553,619 A | 9/1996 | Prince | |
| 5,579,767 A | 12/1996 | Prince | |
| 5,590,654 A | 1/1997 | Prince | |
| 5,594,337 A | 1/1997 | Boskamp | |
| 5,610,520 A | 3/1997 | Misic | |
| 5,666,055 A | 9/1997 | Jones et al. | |
| 6,134,465 A * | 10/2000 | Frederick et al. | 600/410 |
| 6,498,489 B1 * | 12/2002 | Vij | 324/322 |

OTHER PUBLICATIONS

Jones, R. W., et al., "Minimization of Noise Contributions in Multiple Coils: An Overview of Theories with Recommended Improvements," SMRM, p. 369 (1992).

Hyde, J. S., et al., "Quadrature Detection Surface Coil," MRM 4, pp. 179–184 (1987).

Wang, J., "A Novel Method to Reduce the Signal Coupling of Surface Coils for MRI," ISMRM, vol. 3, p. 1434 (1996).

Baum, R. A., et al., "Multicenter Trial to Evaluate Vascular Magnetic Resonance Angiography of the Lower Extremity," JAMA, vol. 274, No. 11, pp. 875–880 (1995).

Medical Advances, The Whole Picture: The New Medical Advances Peripheral Vascular Coil, promotional brochure.

Lang, E. K., "A Survey of the Complications of Percutaneous Retrograde Arteriography," Seldinger Technic, Radiology, 81: pp. 257–263 (1963).

Hessel, S. J., et al., "Complications of Angiography," Radiology, 138: pp. 273–281 (1981).

* cited by examiner

FIG. 4A
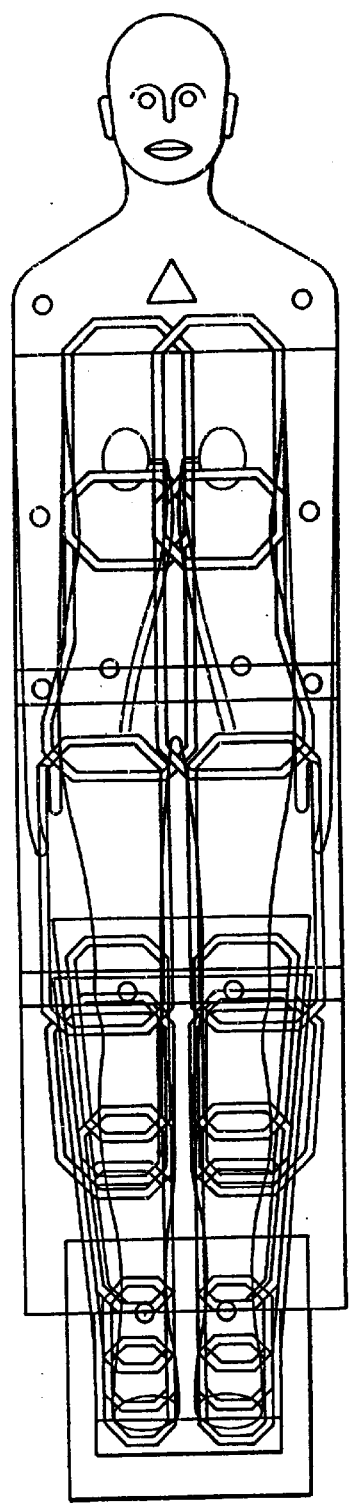

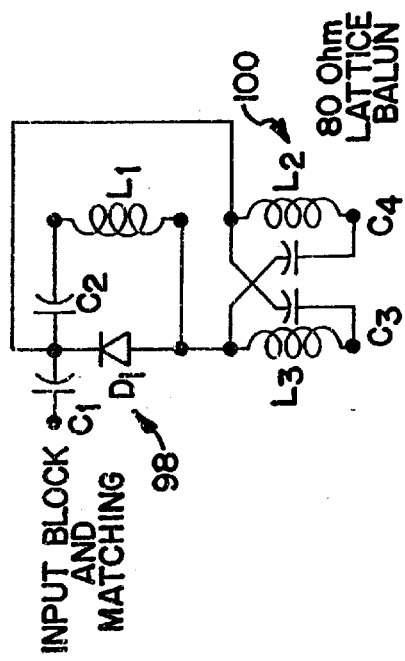
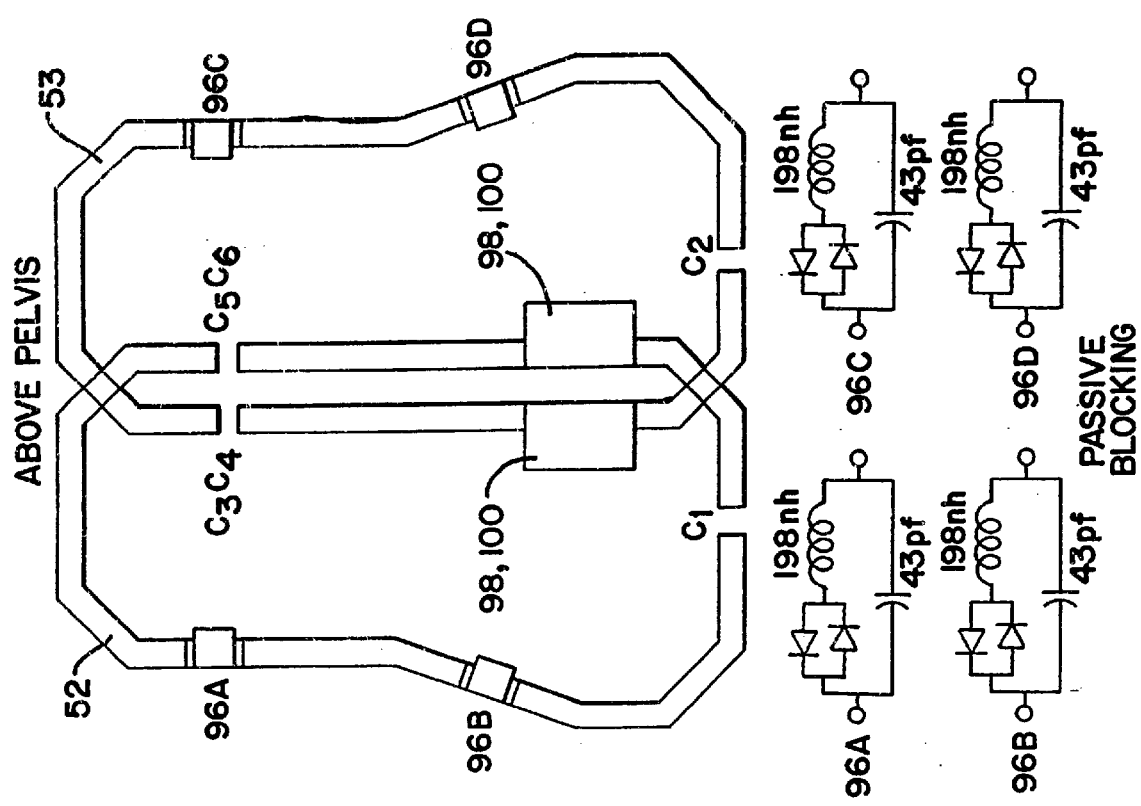
FIG. 6

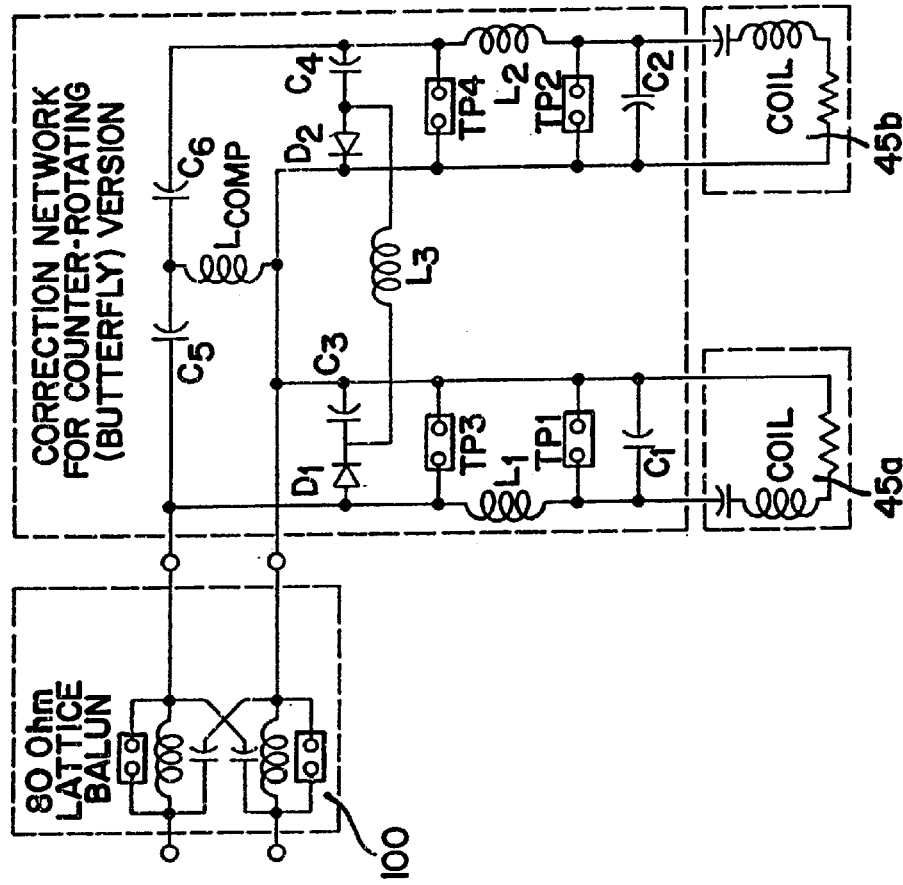
FIG. 9
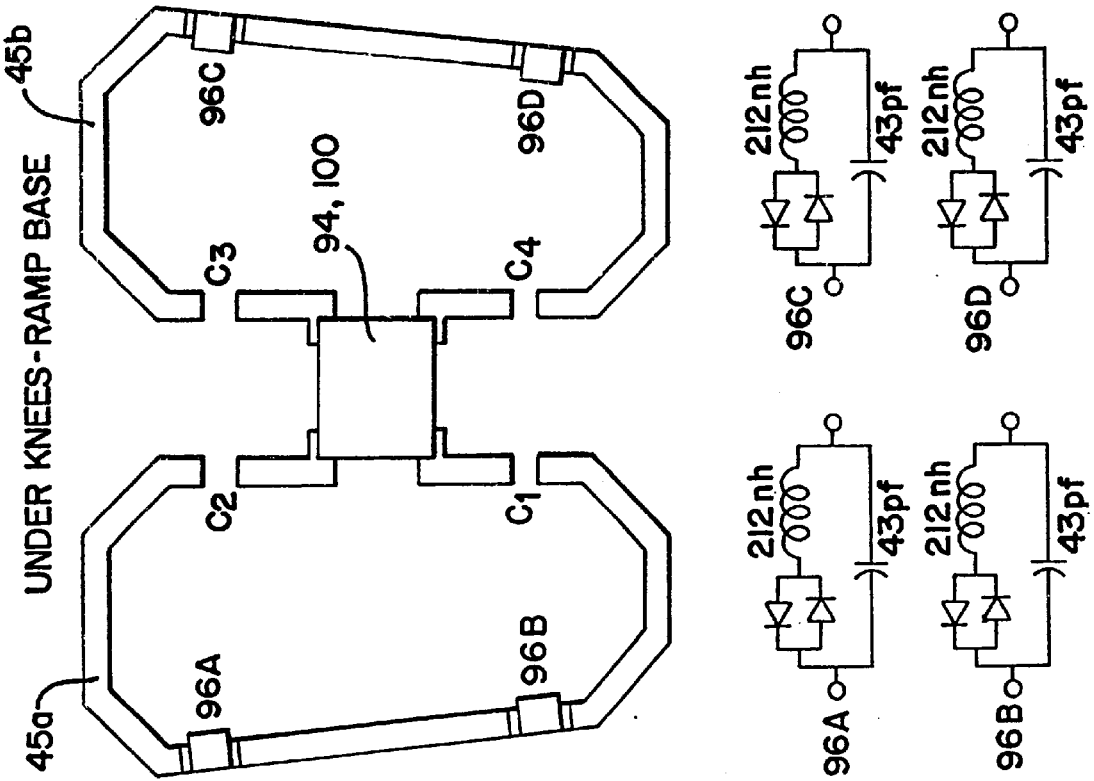

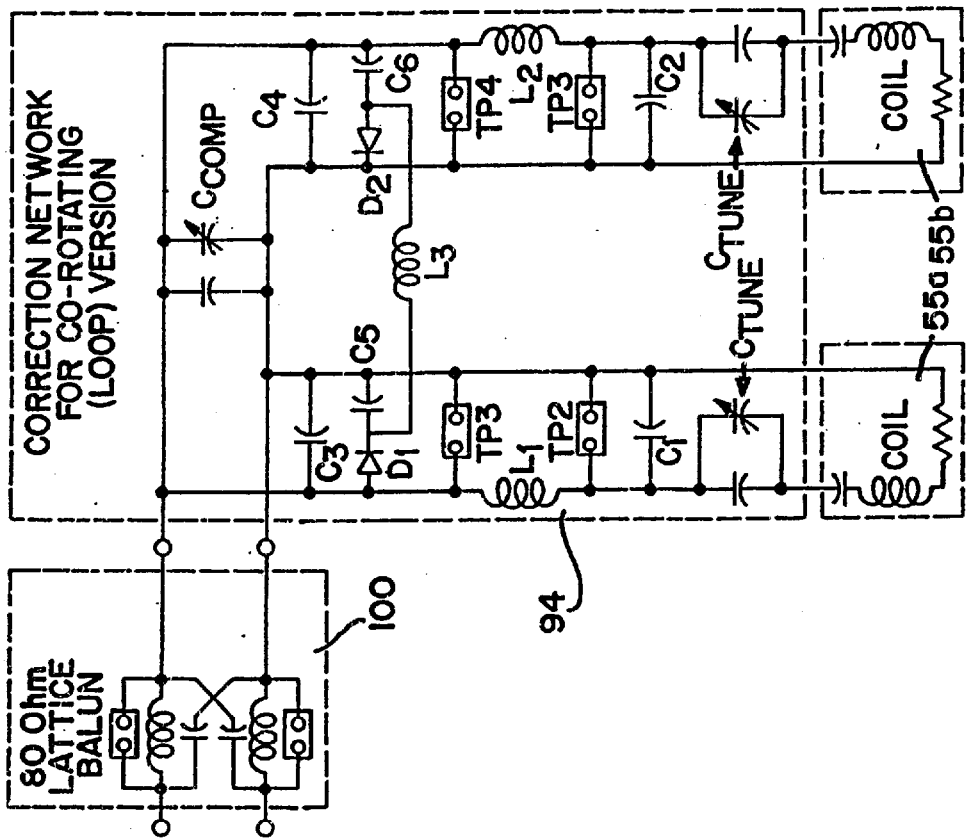
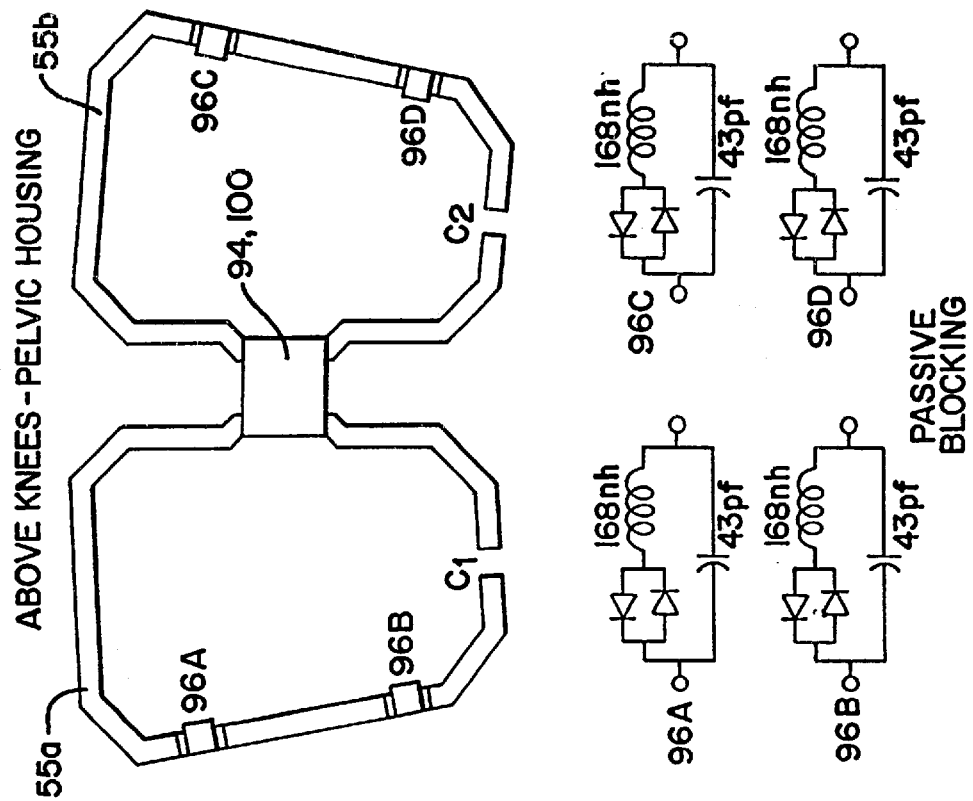

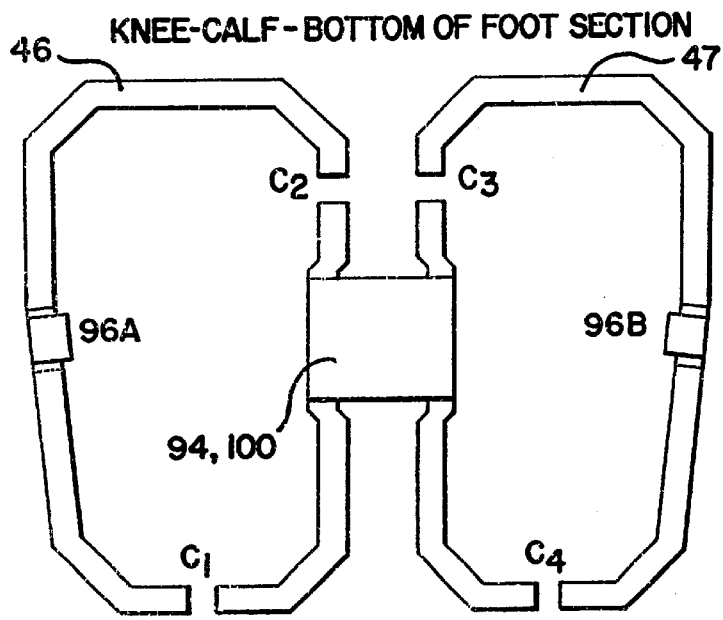
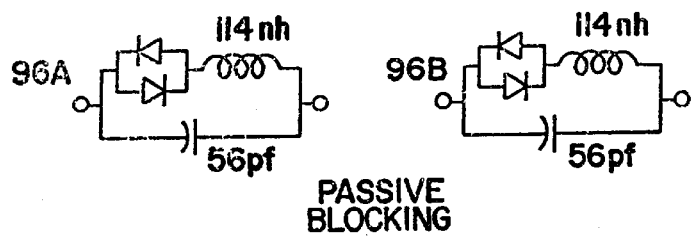
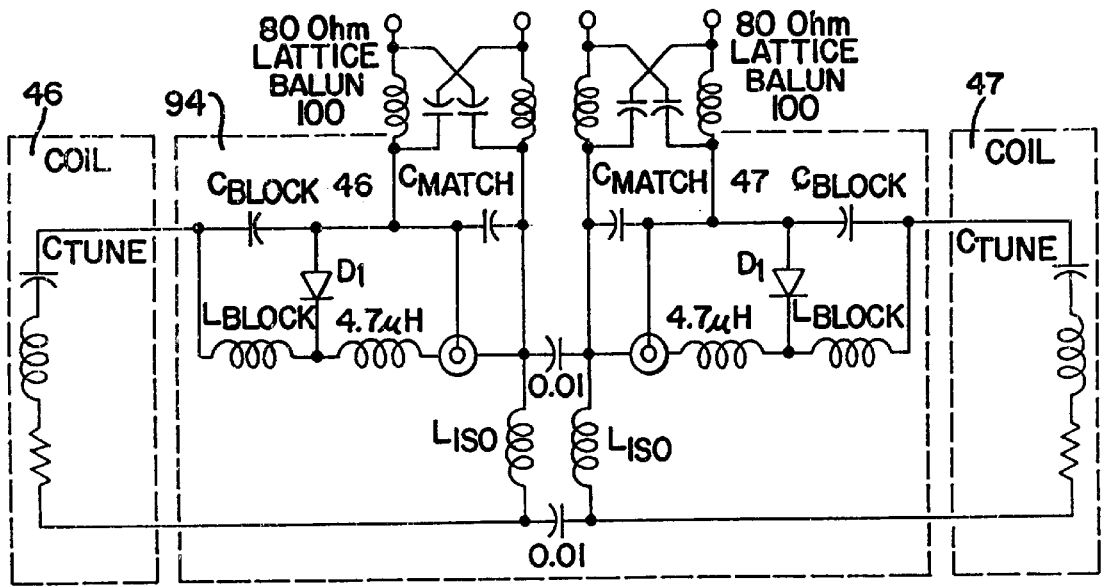
FIG. 11

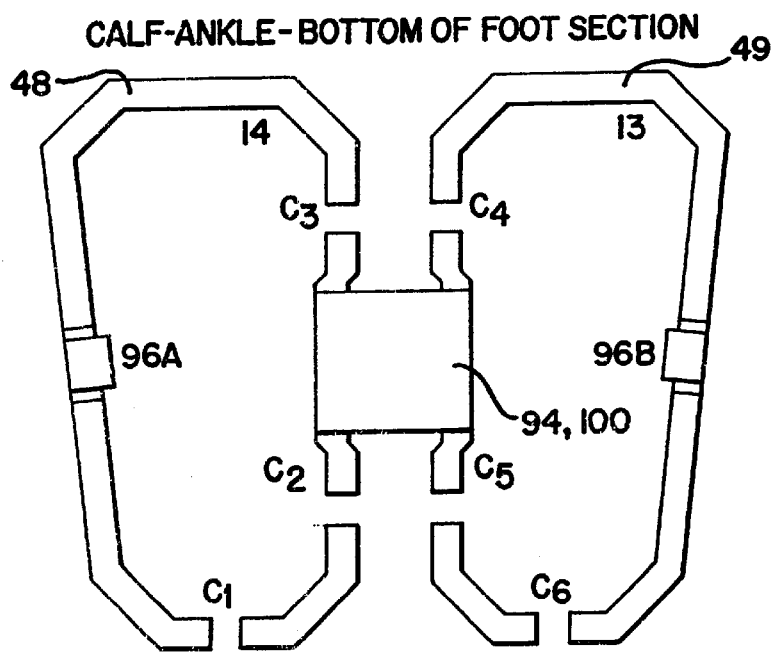
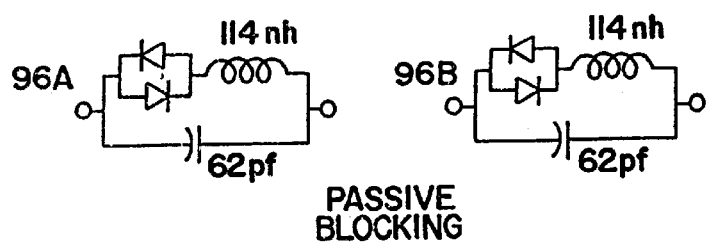
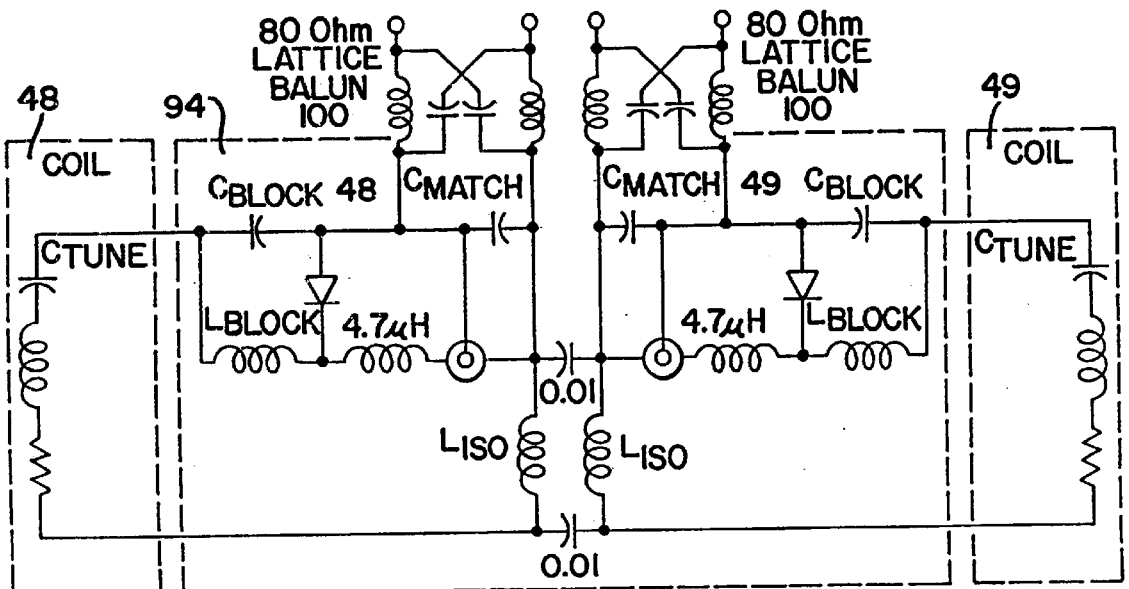
FIG. 13

FIG. 18

| GROUP | MODE | COIL | | | COMMENTS |
|---|---|---|---|---|---|
| 1 | BILATERAL | 42 | 43 | 52 | RENALS & BIFURCATION |
| 2 | BILATERAL | 52 | 53 | 44 | BIFURCATION, FEMORALS ON AN AVERAGE PERSON |
| 3 | BILATERAL | 44 | 54 | 45 | FEMORALS AND KNEES ON TALL PERSON |
| 4 | BILATERAL | 46+47 | 56+57 | 48+49 | LOWER LEGS ON AN AVERAGE PERSON |
| 5 | BILATERAL | 48+49 | 58+59 | 50+51 | ANKLES AND FEET |
| 6 | BILATERAL | 50 | 18 | 60 | FEET |
| 7 | UNILATERAL RIGHT | 46 | 56 | 48 | LOWER RIGHT LEG |
| 8 | UNILATERAL RIGHT | 48 | 58 | 50 | RIGHT ANKLE AND FOOT |
| 9 | UNILATERAL LEFT | 47 | 57 | 49 | LOWER LEFT LEG |
| 10 | UNILATERAL LEFT | 49 | 59 | 51 | LEFT ANKLE AND FOOT |

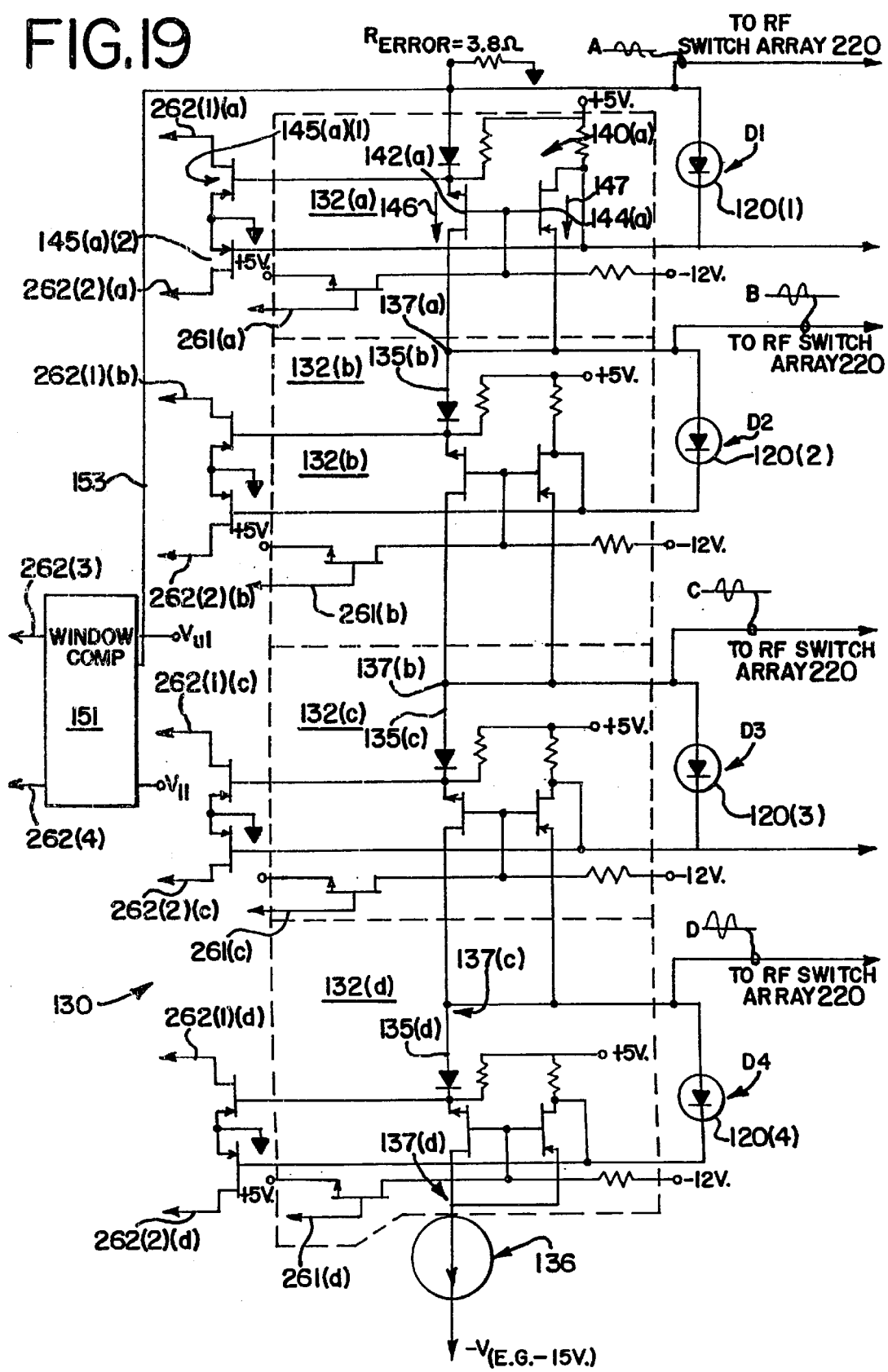

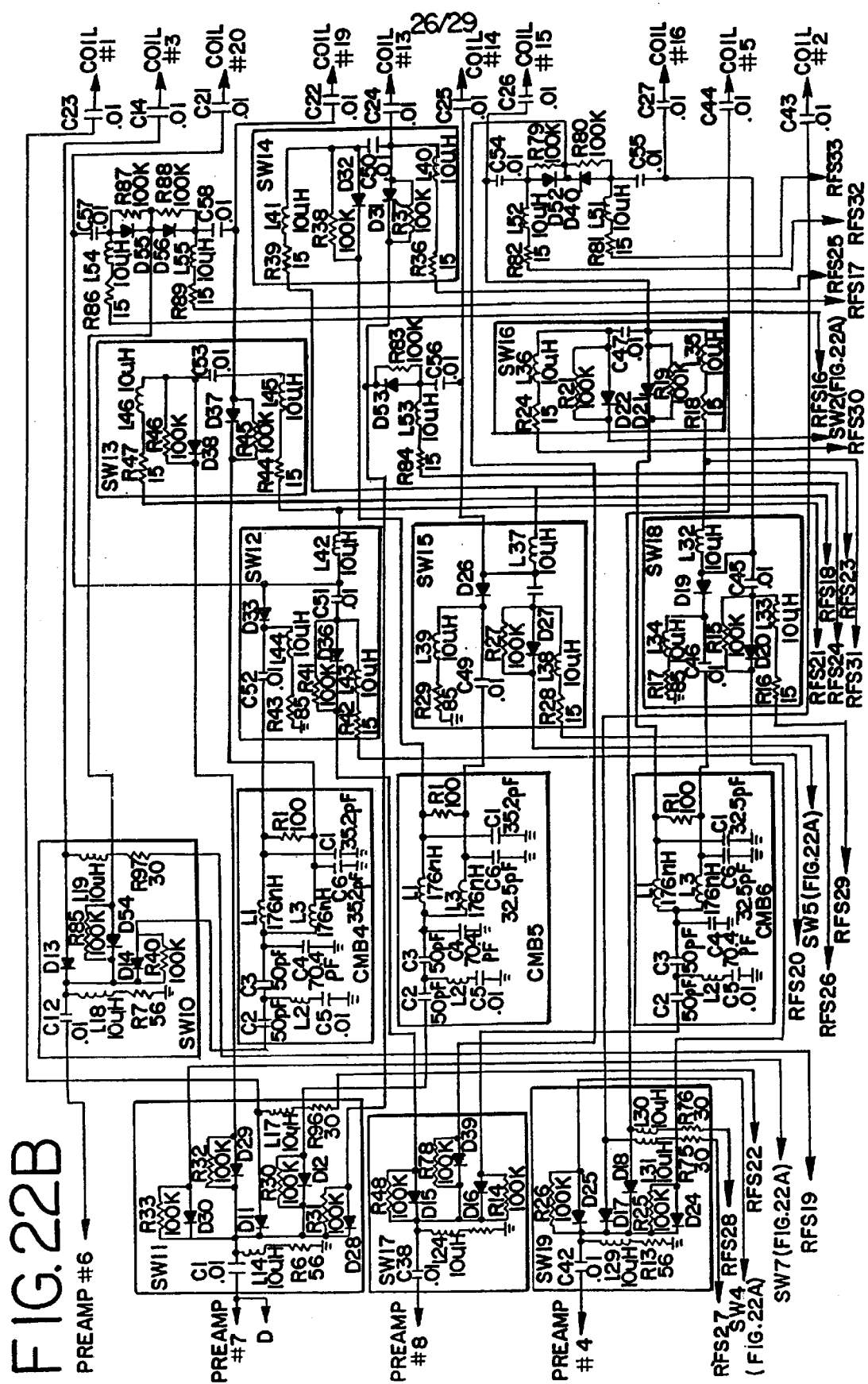

FIG. 23A

PLD #1
U83

| Pin | Signal | | Signal | Pin | Label |
|---|---|---|---|---|---|
| | | I/O21 | 30 | PLD114 |
| 1 | INPUT/GLCRN | I/O22 | 31 | PLD115 |
| 2 | OE2/GCLK2 | I/O23 | 33 | PLD116 |
| 4 | INPUT/OE1 | I/O24 | 34 | PLD117 |
| 3 | INPUT/GCLK1 | I/O25 | 35 | PLD118 |
| | | I/O26 | 36 | PLD119 |
| | | I/O27 | 37 | PLD120 |
| | | I/O28 | 39 | PLD121 |
| | | I/O29 | 40 | PLD122 |
| | | I/O30 | 41 | PLD123 |
| | | I/O31 | 44 | PLD124 |
| | | I/O32 | 45 | PLD125 |
| | | I/O33 | 46 | PLD126 |
| | | I/O34 | 48 | PLD127 |
| | | I/O35 | 49 | PLD128 |
| | | I/O36 | 50 | PLD129 |
| | | I/O37 | 51 | PLD130 |
| | | I/O38 | 52 | PLD131 |
| | | I/O39 | 54 | PLD132 |
| | | I/O40 | 55 | PLD133 |
| 4 | I/O1 | I/O41 | 56 | PLD134 |
| 5 | I/O2 | I/O42 | 57 | PLD135 |
| 6 | I/O3 | I/O43 | 58 | PLD136 |
| 8 | I/O4 | I/O44 | 60 | PLD137 |
| 9 | I/O5 | I/O45 | 61 | PLD138 |
| 10 | I/O6 | I/O/TCK | 62 | |
| 11 | I/O7 | I/O46 | 63 | PLD139 |
| 12 | I/O8 | I/O47 | 64 | PLD140 |
| 14 | I/O/TDI | I/O48 | 65 | PLD141 |
| 15 | I/O9 | I/O49 | 67 | PLD142 |
| 16 | I/O10 | I/O50 | 68 | PLD143 |
| 17 | I/O11 | I/O51 | 69 | PLD144 |
| 18 | | I/O52 | 70 | PLD145 |
| 20 | I/O12 | I/O/TDO | 71 | |
| 21 | I/O13 | I/O53 | 73 | PLD146 |
| 22 | I/O14 | I/O54 | 74 | PLD147 |
| 23 | I/O15 | I/O/TMS | 75 | PLD148 |
| 24 | I/O/TMS | I/O55 | 76 | PLD149 |
| 25 | I/O16 | I/O56 | 77 | PLD150 |
| 27 | I/O17 | I/O57 | 79 | PLD151 |
| 28 | I/O18 | I/O58 | 80 | PLD152 |
| 29 | I/O19 | I/O59 | 81 | PLD153 |
| | I/O20 | I/O60 | | |

EPM7128S 242
370

CIRCUIT FOR SELECTIVELY ENABLING AND DISABLING COILS OF A MULTI-COIL ARRAY

CROSS-REFERENCE TO RELATED APPLICATIONS

This application for patent is a divisional of U.S. application Ser. No. 10/015,190, filed Nov. 26, 2001, which itself is a divisional of U.S. application Ser. No. 08/978,718, filed Nov. 26, 1997, now issued as U.S. Pat. No. 6,323,648 on Nov. 27, 2001. This application thus claims the benefit of the filing date of the grandparent application, Nov. 26, 1997.

BACKGROUND OF THE INVENTION

The present invention relates to nuclear magnetic resonance ("NMR") imaging and, more particularly, to methods and apparatus for imaging the peripheral vasculature.

Initially, NMR imaging systems utilized receiver coils which surrounded the entire sample (for example a human patient) that was to be imaged. These remote coils had the advantage that the sensitivity was, to a first approximation, substantially constant over the entire region being imaged. While this uniformity in sensitivity is not strictly characteristic of such remote coils, the sensitivity is substantially constant to a sufficient degree that most reconstruction techniques assume a constant coil sensitivity. Because of their large size the remote coils suffer from a relative insensitivity to individual spins.

For certain applications, a surface coil is preferable to a remote coil. Surface coils can be made much smaller in geometry than remote coils and for medical diagnostic use can be applied near, on, or inside the body of a patient. This is especially important where attention is being directed to imaging a small region within the patient, rather than an entire anatomical cross section. The use of a surface coil also reduces the noise contribution from electrical losses in the body, with respect to a corresponding remote coil, while maximizing the desired signal. NMR imaging systems thus typically use a small surface coil for localized high-resolution imaging.

A disadvantage of the surface coil, however, is its limited field of view. A single surface coil can only effectively image that region of the sample having lateral dimensions comparable to the surface coil diameter. Therefore, the surface coil necessarily restricts the field of view and inevitably leads to a tradeoff between resolution and field of view. The size of the surface coil is constrained by the intrinsic signal to noise ratio of the coil. Generally, larger coils induce greater patient sample losses and therefore have a larger noise component, while smaller coils have lower noise but in turn restrict the field of view to a smaller region.

One technique for extending the field-of-view limitation of a single surface coil is described in U.S. Pat. No. 4,825,162 to Roemer et al. Roemer et al. describes a set of surface coils arrayed with overlapping fields of view. Each of the surface coils is positioned so as to have substantially no interaction with all adjacent surface coils. A different NMR response signal is received at each different one of the surface coils from an associated portion of the sample enclosed within an imaging volume defined by the array. Each different NMR response signal is used to construct a different one of a like plurality of NMR images of the sample, with the plurality of different images then being combined to produce a single composite NMR image. Roemer et al. describes a four-coil array for imaging the human spine.

While an increased number of surface coils may be used to increase the field of view, NMR system scanners typically have a limited number of preamplifier inputs. The number of preamplifier inputs is therefore a design limitation in the design of phased array surface coils. A disadvantage of known phased array surface coils, therefore, is that the surface coil array may include only as many coils as can be directly connected to the preamplifiers of the system scanner.

One technique for constructing images of areas of greater size from the limited field of view of known surface coil combinations is to move the surface coils after successive scans. This technique, however, requires excessive scan room intervention. That is, after each scan, a technician enters the scan room to physically re-position the coils. This may increase examination time and increase the likelihood of a patient rejecting the procedure.

It would be desirable to obtain increased field of view without scan room intervention.

It would also be desirable to have an improved phased array surface coil for providing a large field of view. It is further desirable to utilize a greater number of surface coils in the array.

SUMMARY OF THE INVENTION

In one aspect of the present invention, a circuit is used to selectively enable and disable n-coils. The circuit includes n-drivers powered by a current source. Each n-driver includes a pair of FETs disposed such that a gate of one FET is connected to a gate of the other FET to form a common gate node thereat. The n-drivers are disposed in a totem-pole configuration. The one FET of a first of the n-drivers has (A) a drain linked to a ground and to an end of a first of the n-coils and (B) a source linked to a drain of the one FET of a second of the n-drivers and to an end of a second of the n-coils. The other FET of the first of the n-drivers has (A) a source linked to an opposite end of the first of the n-coils and (B) a drain linked to the end of the second of the n-coils and to the source of the one FET of the first of the n-drivers. The one FET of the second of the n-drivers also has a source linked to a drain of the one FET of a next of the n-drivers and to an end of a next of the n-coils. The other FET of the second of the n-drivers also has (A) a source linked to an opposite end of the second of the n-coils and (B) a drain linked to the end of the next of the n-coils and to the source of the one FET of the second of the n-drivers. This continues until the one FET and the other FET of an nth of the n-drivers are likewise disposed in the totem-pole configuration of the n-drivers, with a source and a drain of the one FET and the other FET, respectively, of the nth of the n-drivers being connected to the current source. Each of the n-drivers is used to operate a corresponding one of the n-coils by being responsive at its common gate node (i) a coil disable signal by activating the one FET thereof and deactivating the other FET thereof thereby not only drawing current away from and thus disabling the corresponding coil but also allowing the current to flow through the one FET and thus be available as a source of current to a successive one of the n-drivers and (ii) a coil enable signal by deactivating the one FET thereof and activating the other FET thereof thereby allowing the current not only to flow serially through the corresponding coil and the other FET thus enabling the corresponding coil but also to be available as a source of current to the succesive one of the n-drivers.

BRIEF DESCRIPTION OF THE DRAWINGS

FIGS. 4A, 4B and 4C schematically illustrate the capability of the peripheral vascular array housing shown in FIG. 3 to accommodate a variety of body types.

FIGS. 5 through 16 are electrical schematic diagram of the surface coils in the peripheral vascular array shown in FIGS. 2A and 2B.

FIG. 18 is a coil group table showing groups of surface coils, a mode switch setting, surface coils selected by a particular group and comments regarding an image obtained using the selected group of surface coils.

FIG. 19 is an electrical schematic of the T/R driver shown in FIG. 17.

FIGS. 22A and 22B are electrical schematics of a preferred implementation of the RF switch array shown in FIG. 20.

FIG. 23A illustrates a programmable logic device in a preferred implementation of the control logic shown in FIG. 17.

FIGS. 23B and 23C are state tables for the control logic shown in FIG. 17.

DETAILED DESCRIPTION OF THE PRESENTLY PREFERRED EMBODIMENTS

Figure 1:
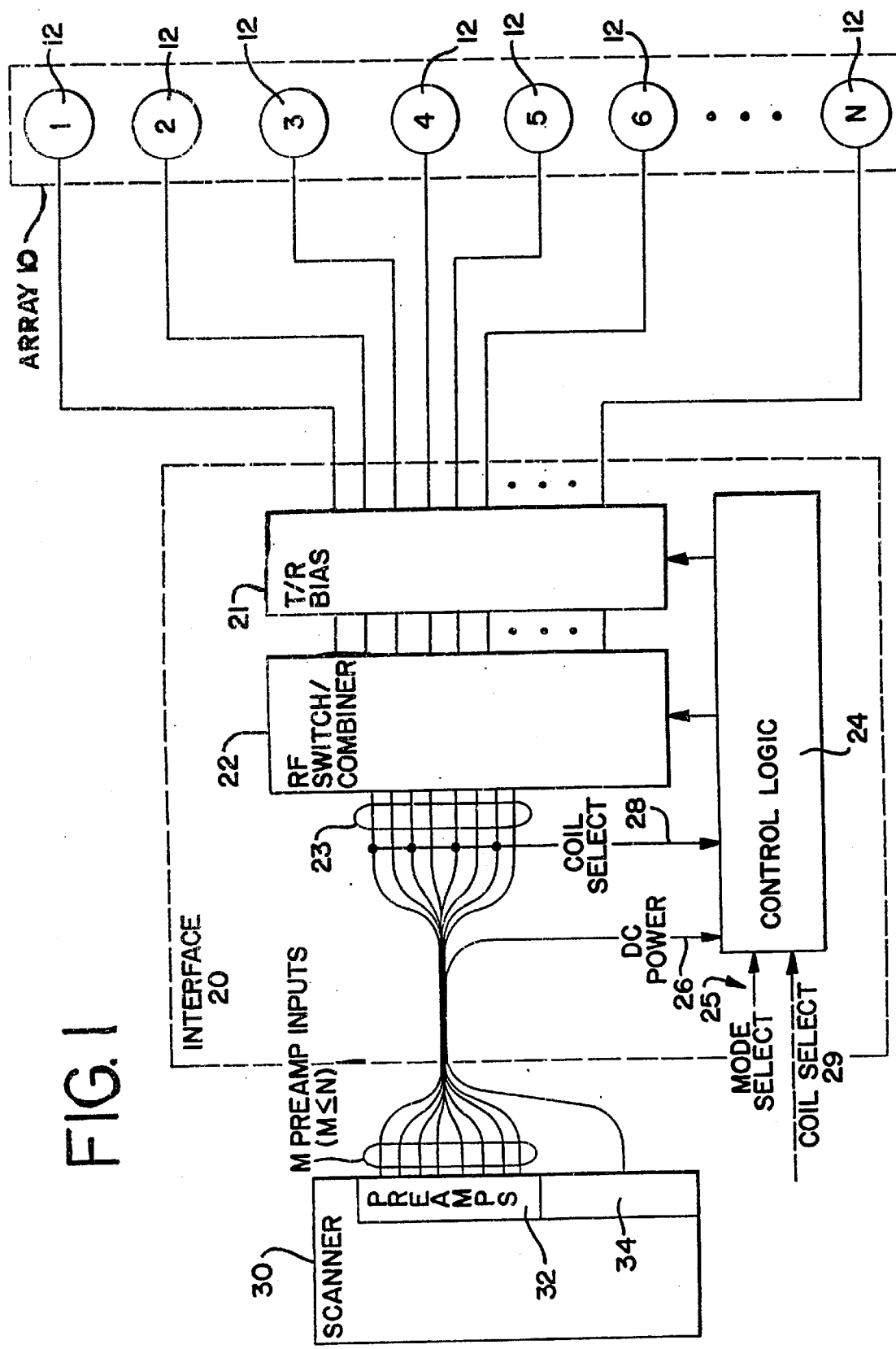
FIG. 1 is a schematic design of a system for receiving an NMR response signal in accordance with a preferred embodiment of the present invention.

FIG. 1 is a schematic diagram of a system for receiving an NMR response signal in accordance with a preferred embodiment of the present invention. The system includes a surface coil array 10 that is connected by an interface 20 to an NMR scanner 30. The surface coil array 10 includes a number, N, of surface coils 12. Each of the surface coils 12 is electrically connected through a transmit/receive ("T/R") bias circuit 21 to an RF switch/combiner 22 in the interface 20. The RF switch/combiner 22 has a plurality of outputs 23 that are connected to a plurality of receiver preamplifiers 32 in the NMR scanner 30.

The interface 20 also includes a control logic circuit 24, which is coupled to and controls the RF switch/combiner 22 and the T/R bias 21. The control logic circuit 24 has three inputs. The first input is a DC power input 26, which is provided by a power supply 34 in the NMR scanner 30. The second input is a coil select input 28. The third input is a mode select input 25. The control logic circuit 24 selectively activates a predetermined arrangement of surface coils 12 in accordance with the coil select input 28 and the mode select input 25.

As shown in FIG. 1, the coil select input 28 originates from the NMR scanner 30. However, the coil select input 28 may alternatively be provided to the control logic circuit 24 from another source that is external to the interface 20, as illustrated by the dashed coil select input 29 in FIG. 1. The coil select input 28 is preferably a DC control signal. Blocking capacitors may therefore be used at the outputs 23 of the RF switch/combiner 22 to block DC from the RF switch 22. In a similar manner, RF chokes may be used on the coil select input 28 to prevent RF signals from reaching the control logic circuit 24. The design of DC blocks and RF chokes are well known to those of ordinary skill in the art. When the coil select input 28 originates from the NMR scanner 30, it may be superimposed on some or all of the outputs 23. As shown in FIG. 1, four outputs 23 are used, such that the coil select signal 28 may be treated as a 4-bit word.

In addition, as shown in FIG. 1, the DC power input 26 is provided by the power supply 34 in the NMR scanner 30. However, the DC power input 26 may alternatively be provided by a power supply, such as a battery, contained within or connected to the interface 20. Preferably, the battery is constructed of materials that are not responsive to and do not adversely effect the magnetic fields in the NMR examination room. For example, the battery may be a rechargeable lead-acid battery with a gel electrolyte and a plastic housing, such as the Gel Cell™ batteries that are commercially available from Globe. As a still further alternative, the DC power input 26 may be provided by any DC source that is external to the scanner 30. These alternatives are particularly appropriate when the scanner 30 either does not provide a DC power supply output or provides a DC power supply output that is insufficient to power the interface 20 and the array 10.

During imaging, the surface coils 12 that are activated to the receive state produce RF signals that are coupled to the RF switch/combiner 22. The outputs 23 of the RF switch/combiner 22 are then coupled to preamplifiers 32 in the NMR scanner 30. The operation of the interface 20 is described in greater detail below with reference to FIGS. 17 through 22.

The scanner 30 includes a predetermined number, M, of the receiver preamplifiers 32. In accordance with a preferred embodiment of the present invention, the interface 20, as described below, allows a surface coil array 10 having a greater number, N, of surface coils 12 than the number, M, of receiver preamplifiers 32, to be connected to the scanner 30 (i.e. N≧M).

In accordance with a preferred embodiment, the array 10 is a receive-only, phased array surface coil and the NMR scanner 30 is capable of operating in a phased array receiving mode. Such NMR scanners are commercially available. For example, the Signa™ family of magnetic resonance imaging systems, equipped with phased array capability, are available from GE Medical Systems, Inc. of Waukesha, Wis. These scanners are designed to accept up to eight preamplifier inputs (M=8).

In accordance with a preferred embodiment of the present invention, the surface coil array 10 is a peripheral vascular array. The peripheral vascular array is useful for studies relating to peripheral vascular disease. These studies may include deep vein thrombosis screening, aortic runoff studies, distal vessel patency, the determination of the existence location, length, and severity of stenoses, and the search for patent distal vessels that are suitable for bypass grafts. The peripheral vascular array is therefore preferably capable of imaging vasculature from the area of the kidneys and descending through the lower extremities to the feet. Because of this large field of view, the peripheral vascular coil may also be useful for applications involving soft tissue imaging, such as screening for metastic disease, and long bone imaging.

Figure 2A:
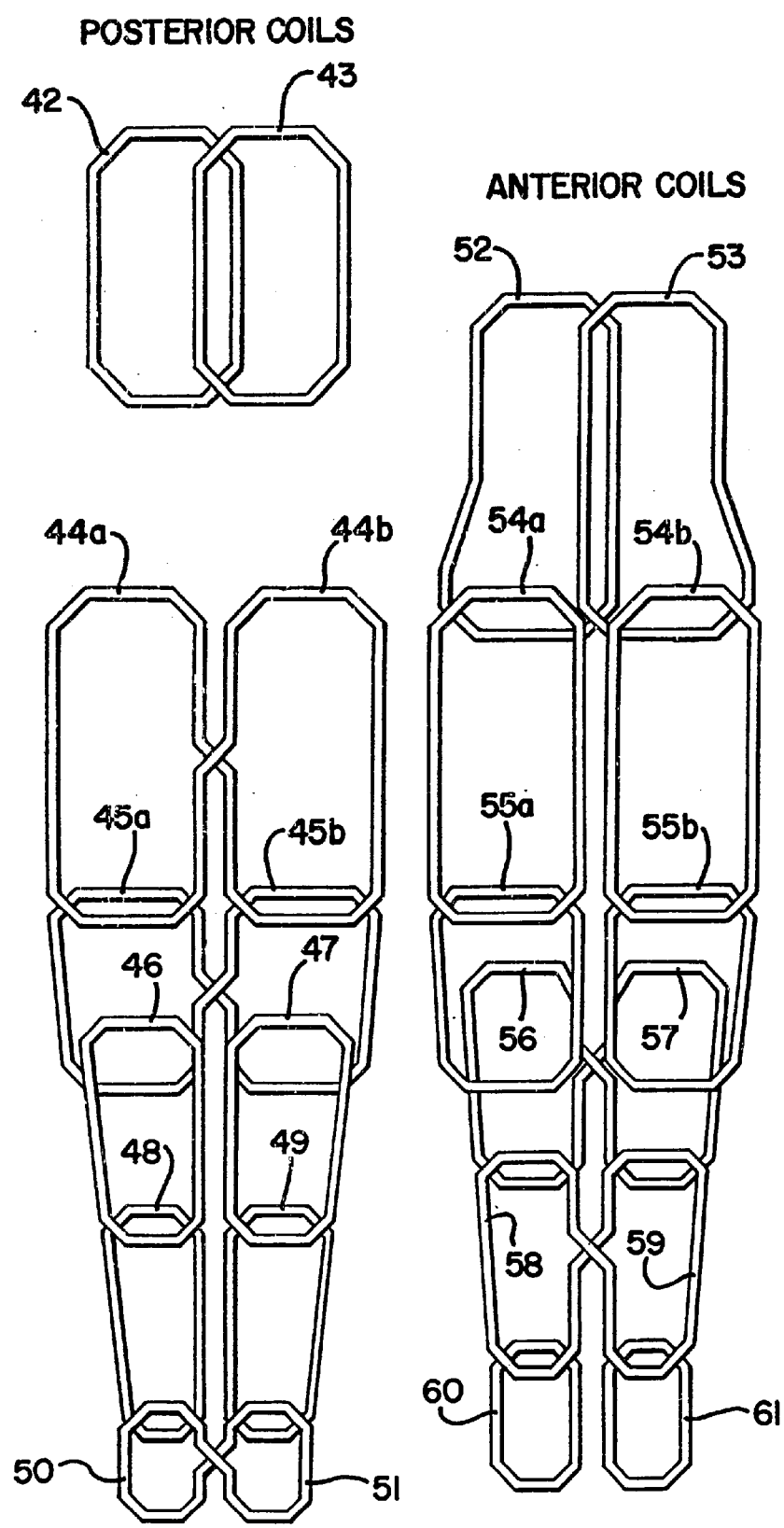
FIGS. 2A and 2B are schematic representations of a peripheral vascular array that is operable with the system of FIG. 1.
Figure 2B:
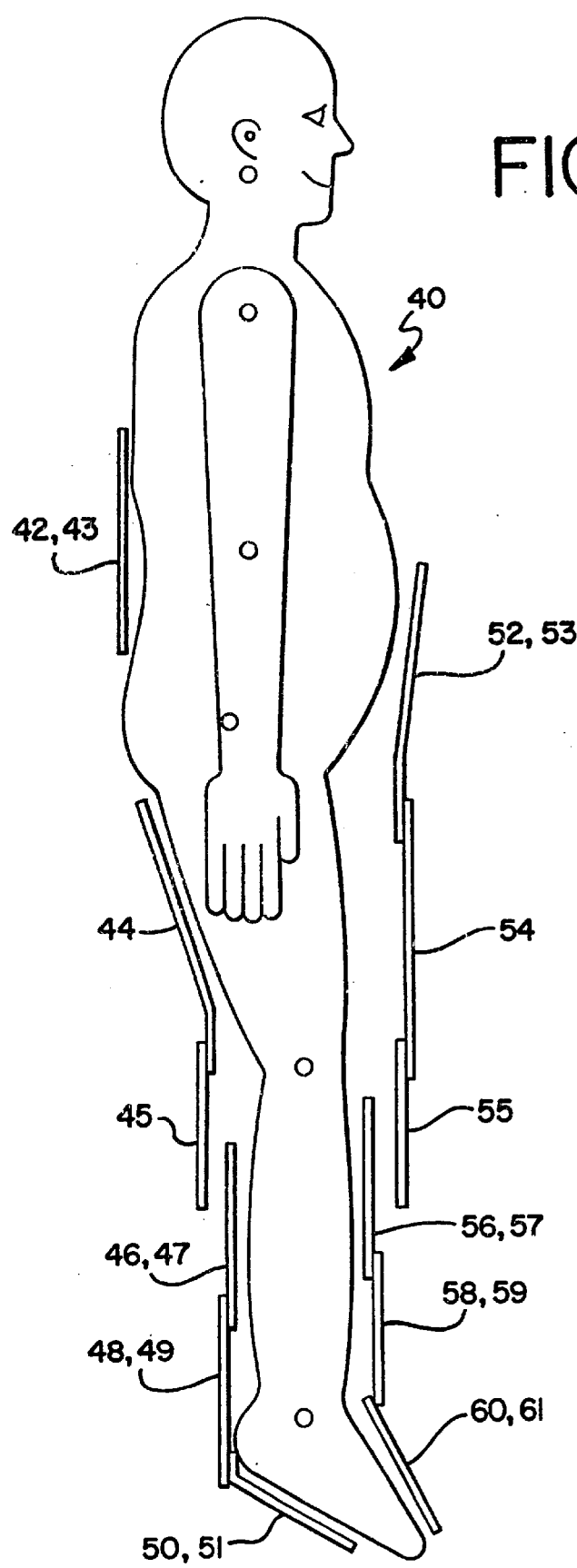

FIGS. 2A and 2B show a schematic representation of a peripheral vascular array 40 in accordance with a preferred embodiment of the present invention. In FIG. 2A, an arrangement of the surface coils in the array 40 is illustrated. The peripheral vascular array 40 includes ten posterior coils, 42 through 51, and ten anterior coils, 52 through 61. Each of the coils 42 through 61 is a surface coil that receives signals from hydrogen protons during NMR imaging.

Referring again to FIG. 2A, surface coils 42, 43, 52 and 53 are single loop coils. Surface coils 44a, 44b and 45a, 45b are counter-rotating loops. Surface coils 54a, 54b and 55a, 55b are co-rotating loops. The surface coils in the lower leg section, surface coils 46–51 and 56–61, are single loops when operated in unilateral mode, as described below. In bilateral mode, which is also described below, surface coil pairs (46, 47), (48, 49) and (60, 61) are combined as co-rotating loops and surface coil pairs (50, 51), (56, 57) and (58, 59) are combined as counter-rotating loops.

FIG. 2B illustrates how the surface coils shown in FIG. 2A may be arranged about the patient to obtain images of the vascular structures of the abdomen, pelvis and lower limbs. In particular, the peripheral vascular array 40 may obtain images of the vascular structures from the renal arteries through the feet without moving the patient or the array 40. Thus, the peripheral vascular array 40 advantageously allows a large region of the patient to be imaged without requiring scan room intervention by an operator. This may decrease examination times and minimize the likelihood of patient rejection.

As shown in FIGS. 2A and 2B, with the exception of the surface coils 42, 43 and 52, 53, where an anteriorly located surface coil overlies a posteriorly located coil, one of the coils is of the co-rotating type and the other is of the counter-rotating type. In addition, where adjacent surface coils in the array 40 may significantly overlap, such as the surface coil 45a, 45b and the surface coil pair 46, 47, one of the coils is preferably of the co-rotating type (e.g. pair 46, 47) and the other is of the counter-rotating type (45a, 45b). This alternation between co-rotating and counter-rotating structures provides the benefit of improving the isolation between the coils, whose intrinsic isolation is then maintained even if the vertical spacing between the coils changes, the superior/inferior offset between opposing coils changes, or the superior/inferior offset between adjacent coils is adjusted. The superior/inferior offset between adjacent coils may be adjusted, for example, by telescoping the surface coils 45 through 51 and 56 through 61 toward or away from the surface coils 45 and 55.

Figure 3:
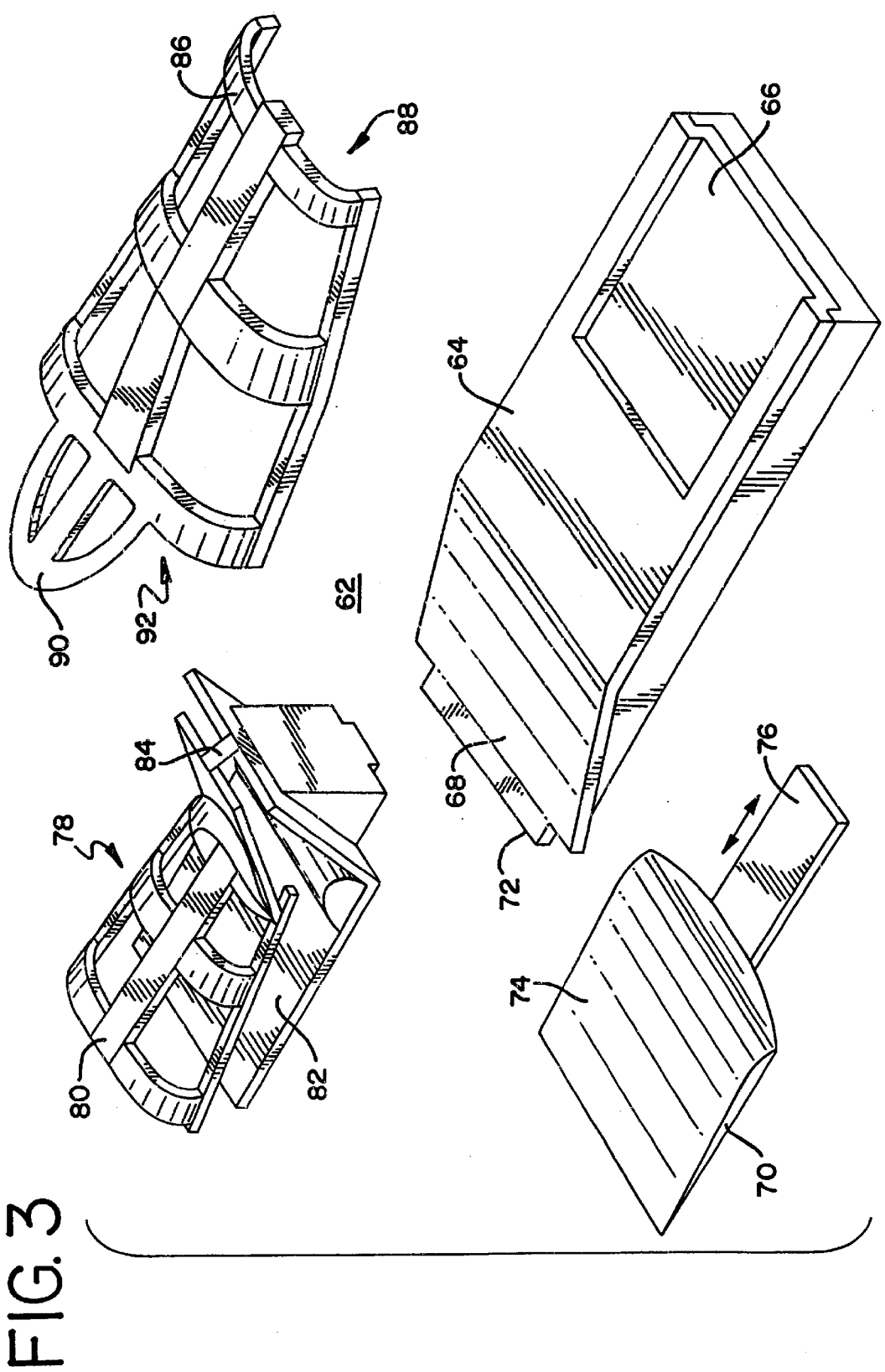
FIG. 3 illustrates an embodiment of a housing for the peripheral vascular array shown in FIGS. 2A and 2B.

FIG. 3 shows an exploded view of a housing 62 for the peripheral vascular array 40. The housing 62 is constructed to position the coils of the peripheral vascular array 40 as shown in FIG. 2B. The housing 62 includes a tray 64 that is constructed to support the legs of the patient. The tray 64 has a recess 66 at its distal end. At the opposite end of the tray 64 from the recess 66, an incline 68 is formed in the upper surface of the tray 64. A lumbar support 70 extends from the tray 64 at an edge 72 adjacent to the incline 68. The lumbar support 70 includes a support surface 74 and a positioning member 76. The positioning member 76 fixes the relative portion of the lumbar support 70 and the tray 64. In the alternative, the positioning member 76 may allow the lumbar support 70 to be extended from or drawn closer to the tray 64 in order to accommodate patients of varying size. The position member 76 extends into the tray 64 at the edge 72.

The housing 62 also includes a leg support structure 78. A top portion 80 of the leg support 78 is attached to a bottom portion 82 by a coupler 84. The coupler 84 preferably allows the position of the top portion 80 to vary with respect to the bottom portion 82. The leg support 78 is slidably mounted within the recess 66 in the tray 64 so that the upper surface of the bottom portion 82 is flush with the upper surface of the tray 64. Because the leg support 78 is slidably mounted, it may be moved to accommodate variations in patient size.

The housing 62 further includes a cover 86. A first end 88 of the cover 86 is shaped to fit over the top portion 80 of the leg support 78. In this manner, the cover 86 may slide over the top of the leg support 78 when the leg support 78 is moved along the recess 66. A flexible extension 90 protrudes from a second end 92 of the cover 86.

The location of the surface coils within the embodiment of the housing 62 that is shown in FIG. 3 will now be described with reference to FIGS. 2A and 2B. The tray 64 includes posterior surface coils 44 and 45, with the surface coil 44 being substantially located below the surface of the incline 68 and the coil 45 being located below the surface of the tray 64, extending substantially into the recess 66. The lumbar support 70 houses posterior coils 42 and 43. The bottom portion 82 of the leg support 78 houses posterior coils 46, 47, 48, 49, 50 and 51, with the even-numbered coils being located beneath the region of the patients lower right leg and foot, and the odd-numbered coils being located beneath the region of the patients lower left leg and foot. The top portion 80 of the leg support 78 houses anterior coils 56, 57, 58, 59, 60 and 61 in the same manner. Finally, the cover 86 houses anterior coils 52, 53, 54 and 55.

In accordance with a preferred embodiment of the present invention, the housing 62 allows the peripheral vascular array 40 to accommodate a wide variety of body styles, including variations in height and weight. For example, as shown in FIG. 2B, only posterior coils 44 and 45 are fixed in position with respect to the tray 64. The locations of the lumber support 70, leg support 78, and cover 86 may all vary with respect to the tray 64.

In addition, the housing 62, and more particularly the tray 64 and lumbar support 70, is perferably designed to align the peripheral vasculature of the patient into a horizontal plane. For example, the lumbar support 70 is located to raise the plane containing the renal arteries with respect to the patient's pelvis, where the external illiac is situated, so that the renal arteries and the external illiac become generally coplanar. In a similar manner, the incline 68 positions the patient's thighs so as to place the femoral arteries in the plane of the external illiac and thee renal arteries. The leg support 78 and the tray 64 then position the popliteal and tibial arteries into approximately the same plane. By then limiting the NMR imaging process to the region about the horizontal plane containing the vasculature of interest, the examination time may be reduced.

Referring again to FIG. 2B, it is evident that the cover 86 is supported at one end by the leg support 78 and at the opposite end by the body of the patient. The flexible extension 90, therefore allows the anterior coils 52, 53, 54 and 55 within the cover 86 to remain as close to the patient as possible. In accordance with an alternative embodiment of the present invention, one or more loaded arms (not shown) may be used to support an anterior portion of the housing 62 away from the patient. Such loaded arm techniques are well known to those skilled in the art.

Figure 4B:
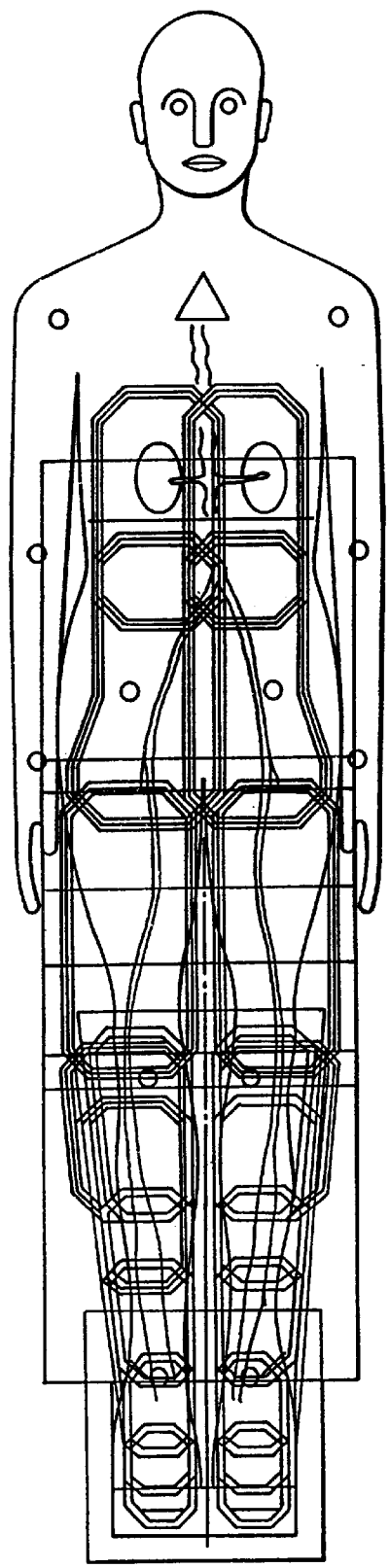
Figure 4C:
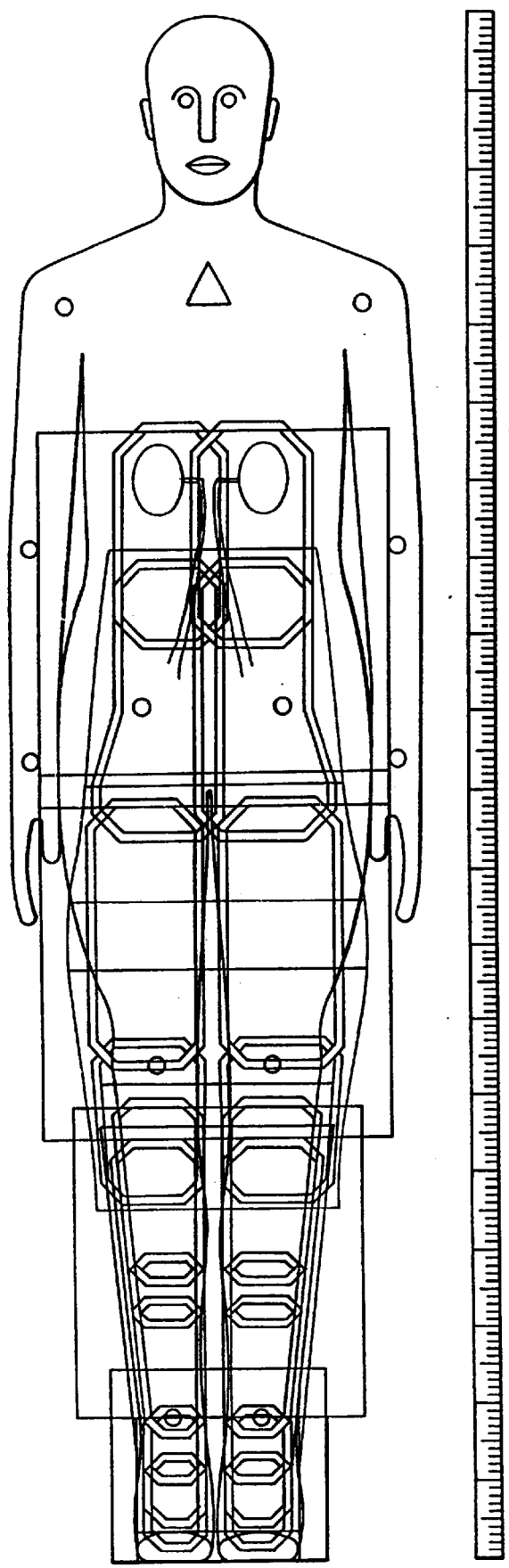

FIGS. 4A, 4B and 4C schematically illustrate the flexibility of the peripheral vascular array 40 in accommodating a variety of body types. As shown in FIGS. 4A through 4C the peripheral vascular array 40 is advantageously able to maintain imaging coverage from the renal arteries through the feet whether the patient is of relatively small stature, such as in FIG. 4A, or large stature, such as in FIG. 4C. This is advantageous because patients afflicted with peripheral vascular disease are frequently significantly larger or smaller than the average person.

The top portion 80 of the leg support 78 and the cover 86 are preferably constructed in a lattice type framework. This reduces the weight of the coil, making it easier for the technician to use while at the same time improving patient comfort by allowing air to flow around the patient to enhance cooling. In addition, the housing 62 allows the patient's arms to remain unrestricted, thereby reducing claustrophobic reactions that are sometimes experienced by patients who are subjected to the close confines of NMR scanners. Moreover, once the peripheral vascular array 40 is adjusted to accommodate the size of the patient, no patient or coil movement is required to complete the examination. This reduces examination times and increases patient comfort.

The surface coils 42–61 are typically formed from copper traces having a thickness of 0.0028" and a width of 0.5". Copper bars or tubing may alternatively be used as coil conductors. The peripheral vascular array 40 preferably contains a practical minimum of conductive materials. This will aid in the reduction of eddy currents at the frequencies corresponding to NMR gradient coil wave forms, thus minimizing the possibility of artifacts. In addition, the peripheral vascular array 40 preferably contains a practical minimum of ferro-magnetic materials to minimize the interaction of the array 40 with the B0 main magnetic field of the host NMR system.

The tray 64 is preferably made from ABS using a vacuum forming process. The surface coils 44 and 45 are then adhered to the bottom of the upper surface of the tray 64. The bottom portion 82 of the leg support 78 is preferably constructed using a low-pressure polyurethane resin to encase the surface coils. Flexible areas of the housing 62, such as the flexible extension 90, are formed by sandwiching the surface coils between foam and then encasing the foam in fabric cover.

FIGS. 5 through 16 are electrical schematic diagrams of the surface coils 42 through 61. Each of the surface coils 42 through 61 preferably includes a PIN diode, D, for switching the surface coils 42 through 61 between the receive state and an active disabled state. This provides the advantage of decreasing undesirable coil interaction that may reduce image quality, particularly during unilateral imaging. As is known in the art, the surface coils are preferably actively disabled by PIN diode switches during the RF transmit state. In addition, FIGS. 5 through 16 show passive blocking networks 96. The passive blocking networks 96 assist the PIN diode switches in disabling the surface coils 42–61 during the RF transmit state.

Figure 5:
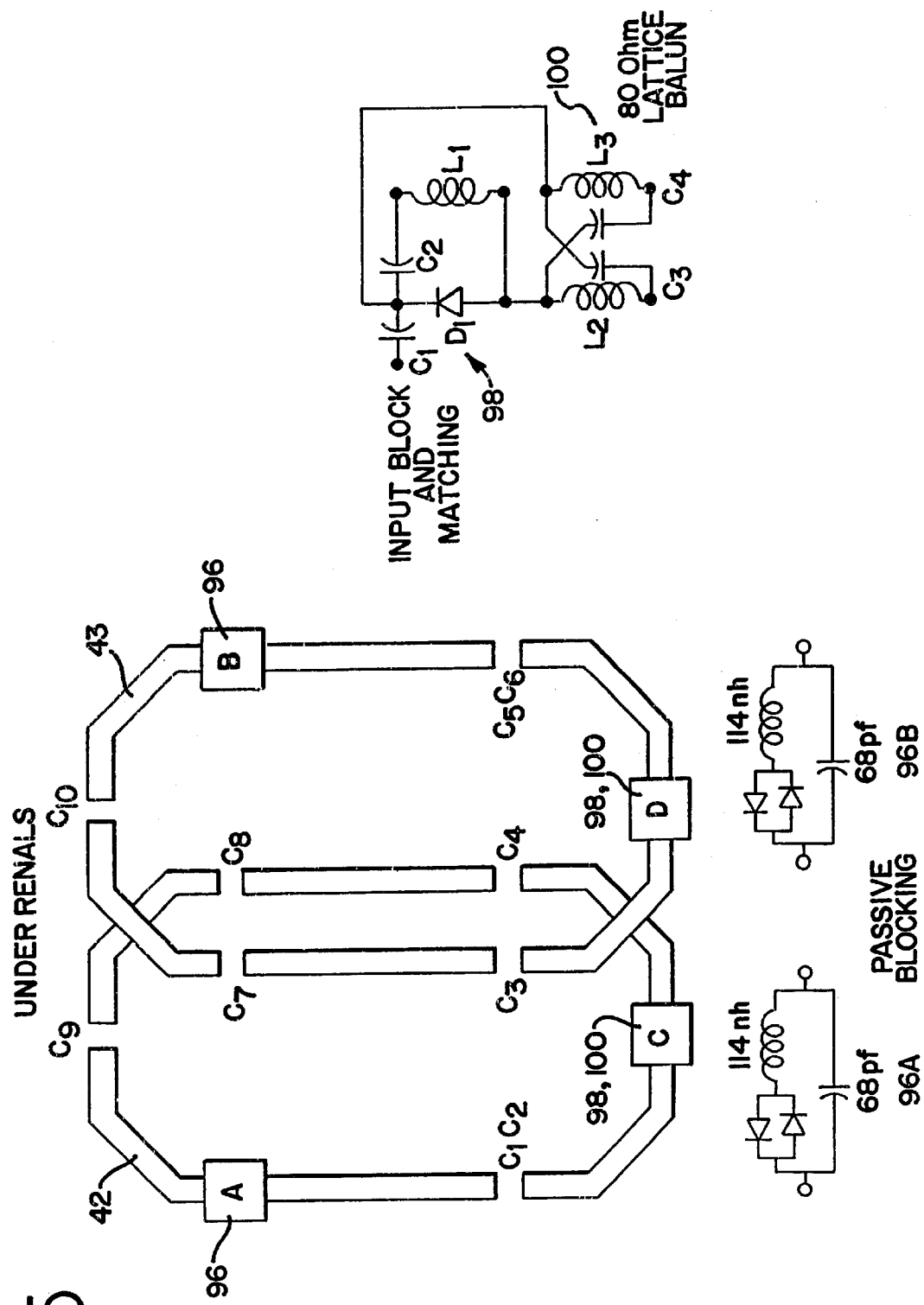

Furthermore, FIGS. 7 through 16 show implementations of networks 94, including component values, for isolating adjacent coils to further improve image quality by reducing shading and aliasing artifacts. The networks 94 in FIGS. 7 through 16 also perform the matching and switching functions. As shown in FIGS. 5 and 6, the mutual inductance between surface coils 42 and 43 and between surface coils 52 and 53 is reduced by overlapping adjacent coils in a manner that is known to those skilled in the art although isolation networks may alternatively be used.

Referring now to FIG. 5, an electrical schematic diagram for the surface coils 42 and 43 is provided. Each surface coil 42 and 43 includes a passive blocking network 96, loop capacitances, and an input network 98. The input network 98 includes the PIN diode, $D_1$, blocking and matching elements, and a 50-Ohm lattice balun 100. The balun 100, which is also shown in FIGS. 6 through 16 (although with differing component values), suppresses common-mode currents. Component values for the elements shown in FIG. 5 are as follows:

| Loop Components | Balun 100 | Input Network 98 |
|---|---|---|
| $C_1, C_5$ = 1–16 pf | $L_2, L_3$ = 142 nh | C1 = 91 pf |
| $C_2$ = 75 pf | $C_3, C_4$ = 51 pf | C2 = 100 pf |
| $C_6$ = 91 pf | | D1 = UM 9415 PIN diode |
| $C_3, C_4$ = 82 pf | | L1 = 92 nh |
| $C_7, C_8$ = 82 pf | | |
| $C_9, C_{10}$ = 82 pf | | |

Diodes=Unitrode Diodes

FIG. 6 is an electrical schematic diagram for surface coils 52 and 53 Component values for the elements shown in FIG. 6 are as follows:

| Loop Components | Balun 100 | Input Network 98 |
|---|---|---|
| $C_1, C_2$ = 51 pf | $L_2, L_3$ = 142 nh | C1 = 56 pf |
| $C_3, C_5$ = 47 pf | $C_3, C_4$ = 51 ph | C2 = 100 pf |
| $C_4, C_6$ = 1–16 pf | | D1 = UM 9415 PIN diode |
| | | L1 = 92 nh |

Figure 7:
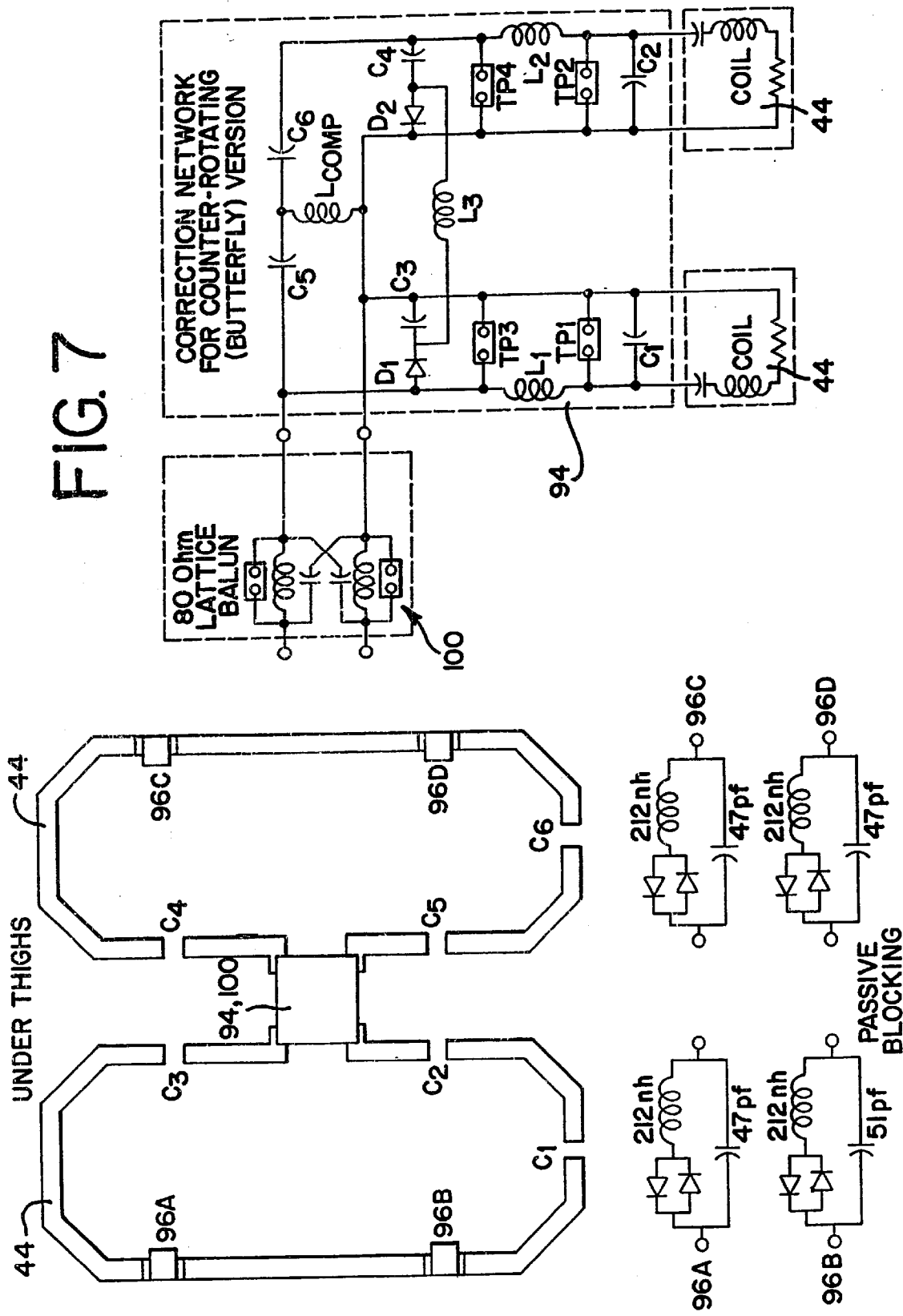

FIG. 7 is an electrical schematic diagram for surface coil 44. In addition to passive blocking networks 96, loop capacitances and a 50-Ohm lattice balun 100, the surface coil 44 includes a network 94 for isolating the counter-rotating loops of the surface coil 44. Component values for the elements shown in FIG. 7 are as follows:

| Loop Components | Balun 100 | Network (Correction, Decoupling & Match) 94 |
|---|---|---|
| $C_3$ = 39 pf + 1–16 pf | C = 51 pf | C1 = 75 pf |
| $C_4$ = 39 pf + 1–16 pf | L = 142 nh | L1 = 88 nh |
| $C_1$ = 56 pf | | C2 = 75 pf |
| $C_2$ = 47 pf | | L2 = 88 nh |
| $C_5$ = 47 pf | | L3 = 4.7 uh |
| $C_6$ = 56 pf | | C3 = .01 uf |
| | | C4 = .01 uf |
| | | C5 = .01 uf |
| | | C6 = .01 uf |
| | | Lcomp = 114 mh |
| | | Diodes = UM 9415 PIN Diode |

Figure 8:
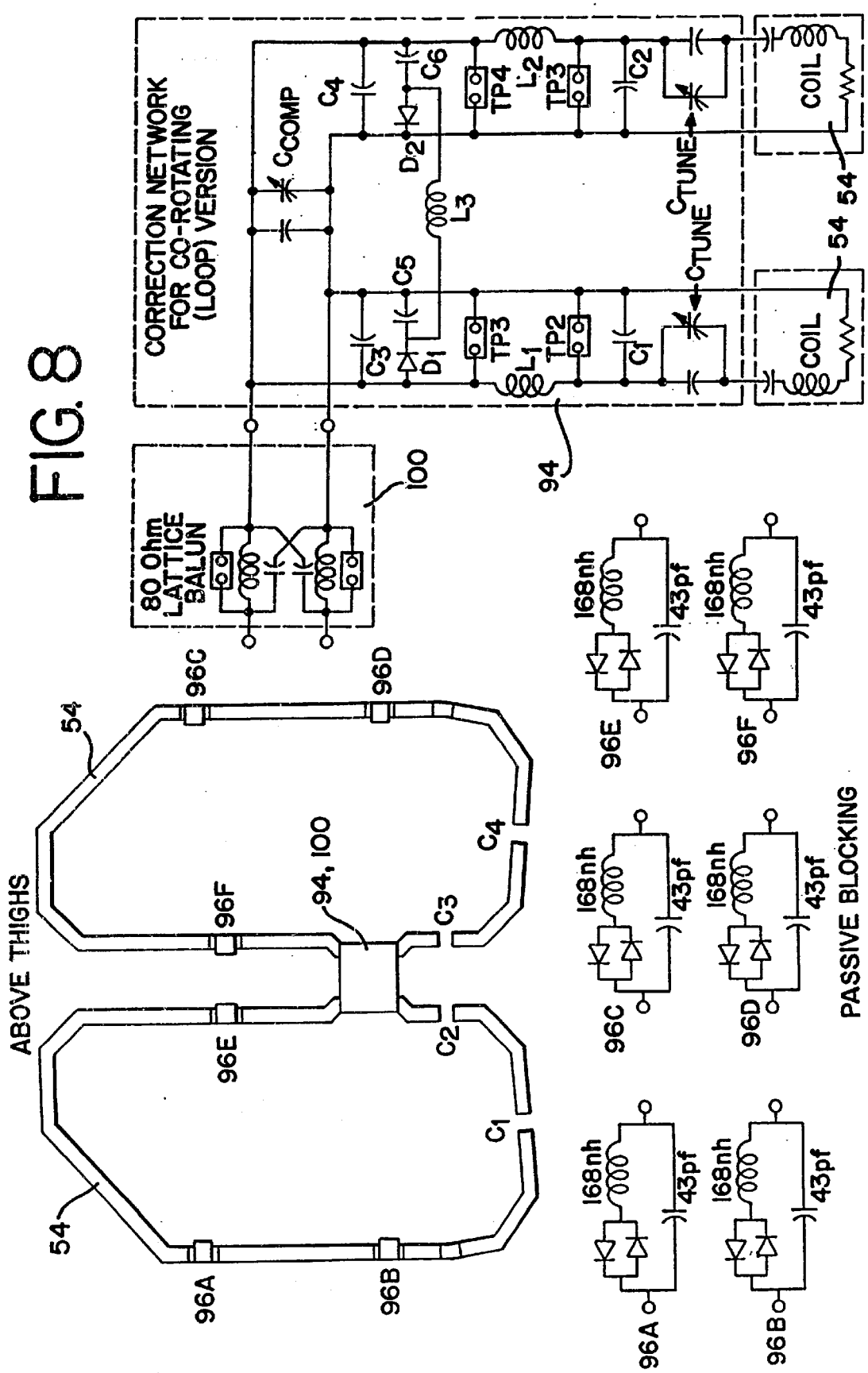

FIG. 8 is an electrical schematic diagram for surface coil 54. A network 94 is included for isolating the co-rotating loops of the surface coil 54. Component values for the elements shown in FIG. 8 are as follows:

| Loop Components | Balun 100 | Network (Correction, Decoupling & Match) 94 |
|---|---|---|
| $C_1$ = 47 pf | C = 51 pf | C1 = 56 pf |
| $C_2$ = 47 pf | L = 142 nh | L1 = 110 nh |
| $C_3$ = 47 pf | | C2 = 56 pf |
| $C_4$ = 47 pf | | L2 = 110 nh |
| | | L3 = 4.7 uh |
| | | Ccomp = 43 pf |

-continued

| Loop Components | Balun 100 | Network (Correction, Decoupling & Match) 94 |
|---|---|---|
| | | C3 = N/A |
| | | C4 = N/A |
| | | C5 = .01 uf |
| | | C6 = .01 uf |
| | | Ctune = 39 pf + 1–16 pf |
| | | Diodes = UM 9415 PIN Diode |

FIG. 9 is an electrical schematic diagram for surface coil 45, which includes two counter-rotating loops 45a and 45b. A network 94 is included for isolating the loops. Component values for the elements shown in FIG. 9 are as follows:

| Loon Components | Balun 100 | Network (Correction, Decoupling & Match) 94 |
|---|---|---|
| $C_1$ = 75 pf | C = 51 pf | C1 = 91 pf |
| $C_2$ = 68 pf + 1–16 pf | L = 142 nh | L1 = 88 nh |
| $C_3$ = 68 pf + 1–16 pf | | C2 = 91 pf |
| $C_4$ = 75 pf | | L2 = 88 nh |
| | | L3 = 4.7 uh |
| | | Diodes = UM 9415 PIN Diode |
| | | C3 = .01 uf |
| | | C4 = .01 uf |
| | | C5 = .01 uf |
| | | C6 = .01 uf |
| | | Lcomp = 198 nh |

FIG. 10 is an electrical schematic diagram for surface coil 55, which includes two co-rotating loops 55a and 55b. Component values for the elements shown in FIG. 10 are as follows:

| Loop Components | Balun 100 | Network (Correction, Decoupling & Match) 94 |
|---|---|---|
| $C_1$ = 43 pf | C = 51 pf | C1 = 102 pf |
| $C_2$ = 43 pf | L = 142 nh | L1 = 75 nh |
| | | C2 = 102 pf |
| | | L2 = 72 nh |
| | | L3 = 4.7 uh |
| | | Ccomp = 30 pf + 1–16 pf |
| | | C3 = 30 pf |
| | | C4 = 30 pf |
| | | C5 = .01 uf |
| | | C6 = .01 uf |
| | | Ctune = 43 pf + 1–16 pf |
| | | Diodes = UM 9415 PIN Diode |

FIG. 11 is an electrical schematic diagram for surface coils 46 and 47. Since the surface coils 46 and 47 may be used in either bilateral mode (both on) or unilateral mode (one on, the other off), each of the surface coils has a 50 Ohm output 100 and a PIN diode switch, $D_1$. Component values for the elements shown in FIG. 11 are as follows:

| Loop Components | Balun | Network (Correction, Decoupling & Match) 94 |
|---|---|---|
| $C_1$ = 41 pf | C = 51 pf | C match 47 = 120 pf |
| $C_2$ = 51 pf + 1–16 pf | L = 142 nh | C block 47 = 62 pf |
| $C_3$ = 51 pf + 1–16 pf | | L block 47 = 142 nh |
| $C_4$ = 41 pf | | L ISO 47 = 74 nh |

-continued

| Loop Components | Balun | Network (Correction, Decoupling & Match) 94 |
|---|---|---|
| | | C match 46 = 91 pf |
| | | C block 46 = 62 pf |
| | | L block 46 = 142 nh |
| | | L ISO 46 = 92 nh |
| | | Diodes, $D_1$ = UM 9415 PIN Diode |

Figure 12:
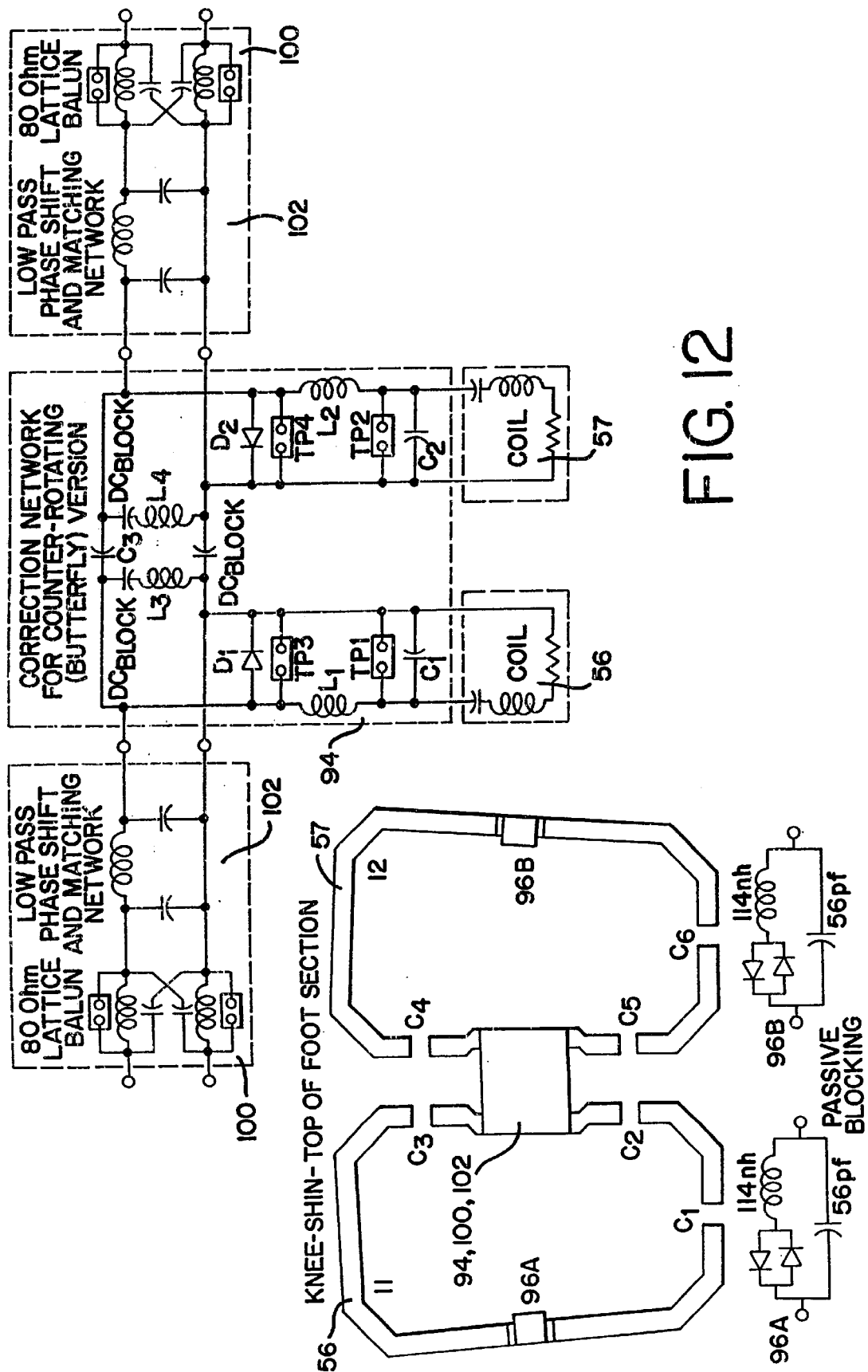

FIG. 12 is an electrical schematic diagram for surface coils 56 and 57. Like the surface coils 46 and 47, the surface coils 56 and 57 may be used in either bilateral or unilateral mode. A low-pass phase shift and matching network 102 couples the balun 100 to the network 94 for each coil 56 and 57. Component values for the elements shown in FIG. 12 are as follows:

| Loop Components | Balun 100 | Low Pass Match 102 |
|---|---|---|
| $C_1$ = 56 pf | C = 51 pf | C = 24 pf |
| $C_2$ = 68 | L = 142 nh | L = 258 nh |
| $C_3$ = 75 pf + 1–16 pf | | |
| $C_4$ = 75 pf + 1–16 pf | | |
| $C_5$ = 68 pf | | |
| $C_6$ = 56 pf | | |

| Network (Correction, Decoupling & Match) 94 |
|---|
| C1 = 103 pf |
| L1 = 86 nh |
| C2 = 103 pf |
| L2 = 86 nh |
| C3 = 33 pf |
| L3 = 198 nh |
| L4 = 198 nh |

Diodes=UM 9415 PIN Diode

FIG. 13 is an electrical schematic diagram for surface coils 48 and 49. The surface coils 48 and 49 may be used in either bilateral or unilateral mode. Component values for the elements shown in FIG. 13 are as follows:

| Loop Components | Balun 100 | Network (Correction, Decoupling & Match) 94 |
|---|---|---|
| $C_1$ = 75 pf | C = 51 pf | C match 49 = 270 pf |
| $C_2$ = 82 pf | L = 142 nh | C block 49 = 62 pf |
| $C_3$ = 75 pf + 1–16 pf | | L block 49 = 142 nh |
| $C_4$ = 75 pf + 1–16 pf | | L ISO 49 = 74 nh |
| $C_5$ = 82 pf | | |
| $C_6$ = 75 pf | | |
| | | C match 48 = 240 pf |
| | | C block 48 = 62 pf |
| | | L block 48 = 142 nh |
| | | L ISO 48 = 92 nh |
| | | Diodes = UM 9415 PIN Diode |

Figure 14:
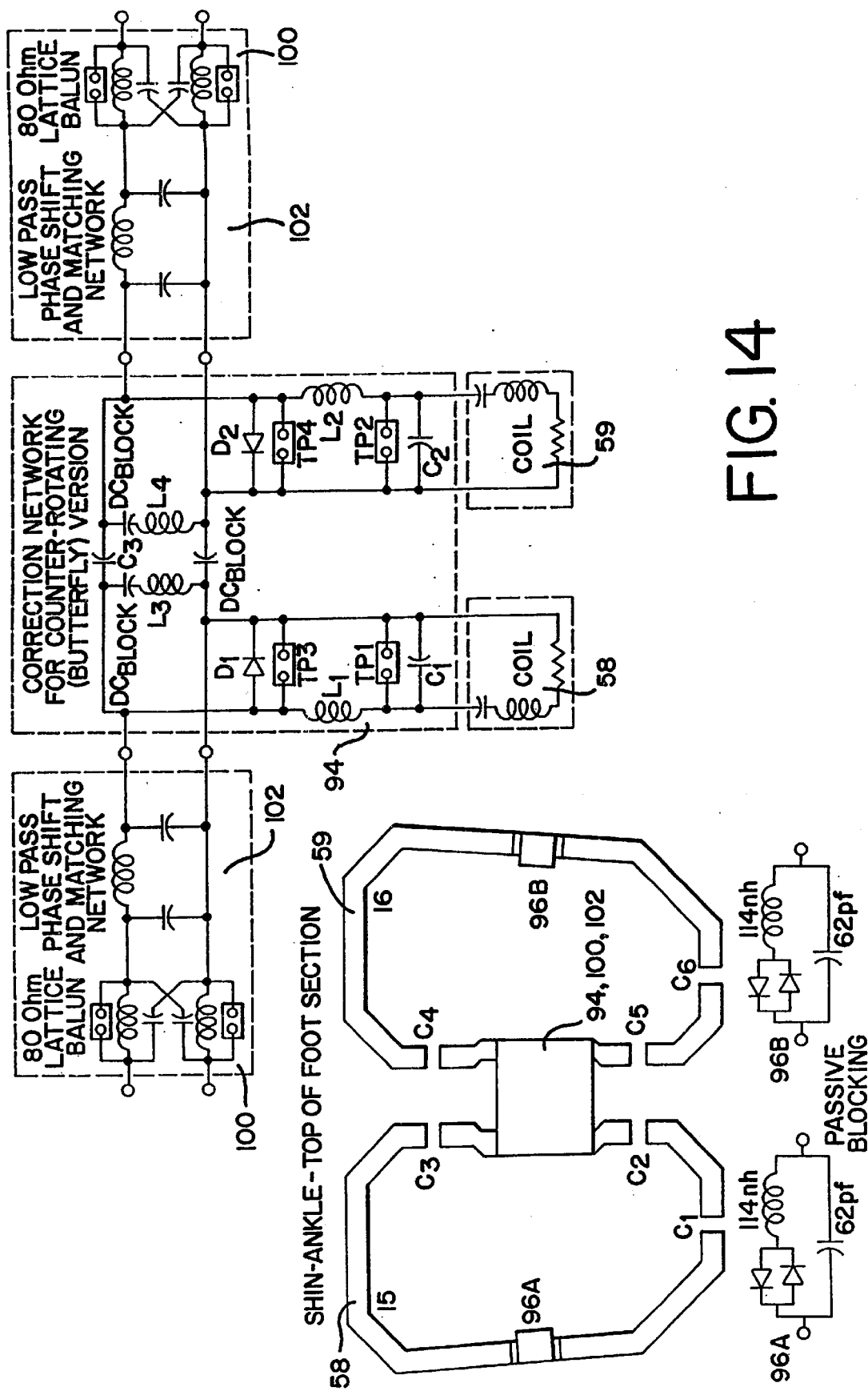

FIG. 14 is an electrical schematic diagram for surface coils 58 and 59. The surface coils 58 and 59 may be used in either bilateral or unilateral mode. A low-pass phase shift and matching network 102 couples the balun 100 to the network 94 for each coil 58 and 59. Component values for the elements shown in FIG. 14 are as follows:

| Loop Components | Balun 100 | Low Pass Matching 102 |
|---|---|---|
| $C_1$ = 91 pf | C = 51 pf | C = 24 pf |
| $C_2$ = 91 pf | L = 142 nh | L = 258 nh |
| $C_3$ = 68 pf + 1–16 pf | | |
| $C_4$ = 68 pf + 1–16 pf | | |
| $C_5$ = 91 pf | | |
| $C_6$ = 91 pf | | |
| Network (Correction, Decoupling & Match) 94 | | |
| C1 = 130 pf | | |
| L1 = 65 nh | | |
| C2 = 130 pf | | |
| L2 = 65 nh | | |
| C3 = 47 pf | | |
| L3 = 142 nh | | |
| L4 = 142 nh | | |
| Diodes = UM 9415 PIN Diode | | |

Figure 15:
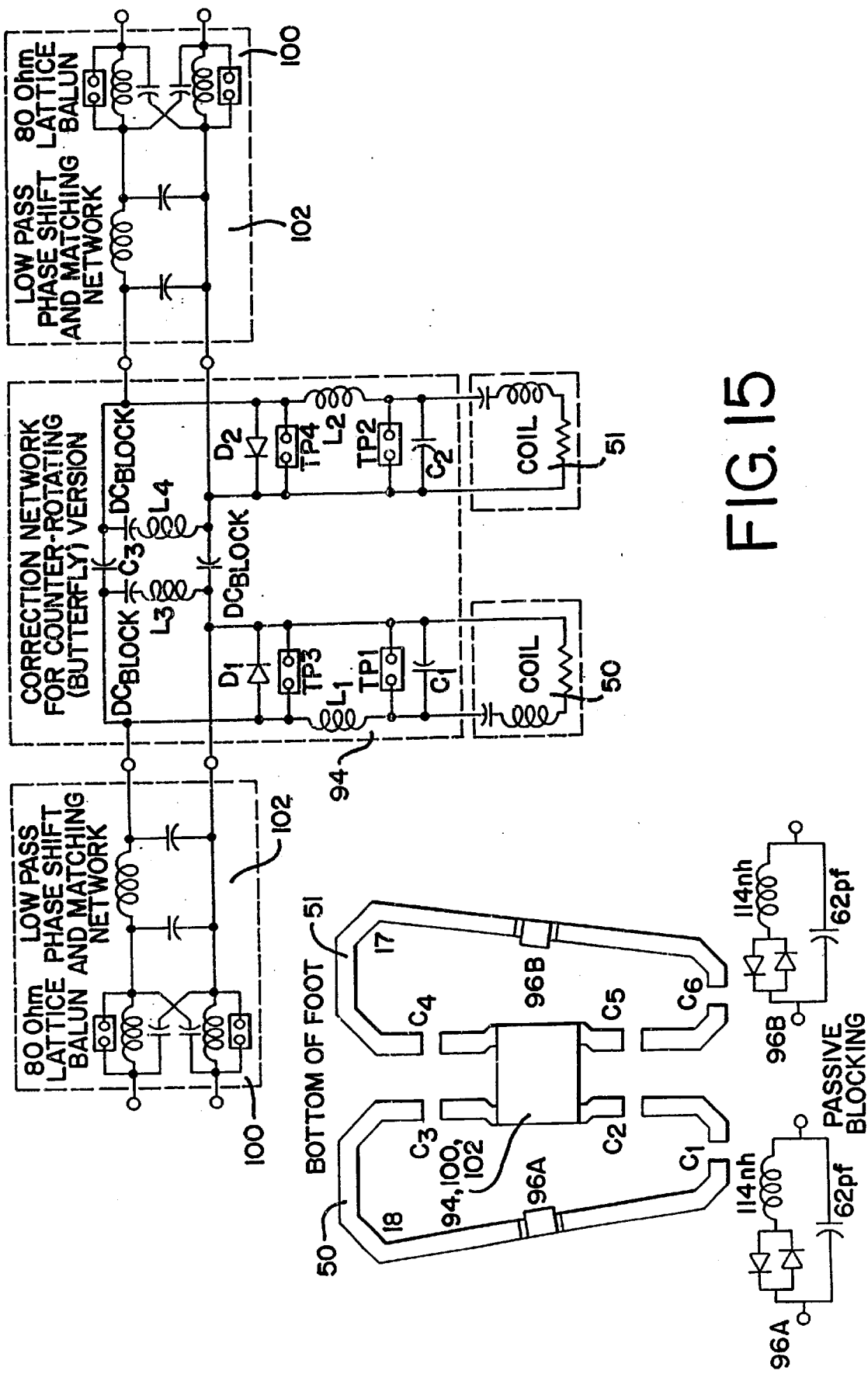

FIG. 15 is an electrical schematic diagram for surface coils 50 and 51. The surface coils 50 and 51 may be used in either bilateral or unilateral mode. A low pass phase shift and matching network 102 couples the balun 100 to the network 94 for each coil 50 and 51. Component values for the elements shown in FIG. 15 are as follows:

| Loop Components | Balun 100 | Low Pass Matching 102 |
|---|---|---|
| $C_1$ = 68 pf | C = 51 pf | C = 24 pf |
| $C_2$ = 68 pf | L = 142 nh | L = 258 nh |
| $C_3$ = 62 pf + 1–16 pf | | |
| $C_4$ = 62 pf + 1–16 pf | | |
| $C_5$ = 68 pf | | |
| $C_6$ = 68 pf | | |
| Network (Correction, Decoupling & Match) 94 | | |
| C1 = 130 pf | | |
| L1 = 68 nh | | |
| C2 = 130 pf | | |
| L2 = 68 nh | | |
| C3 = 47 pf | | |
| L3 = 114 nh | | |
| L4 = 114 nh | | |
| Diodes = UM 9415 PIN Diode | | |

Figure 16:
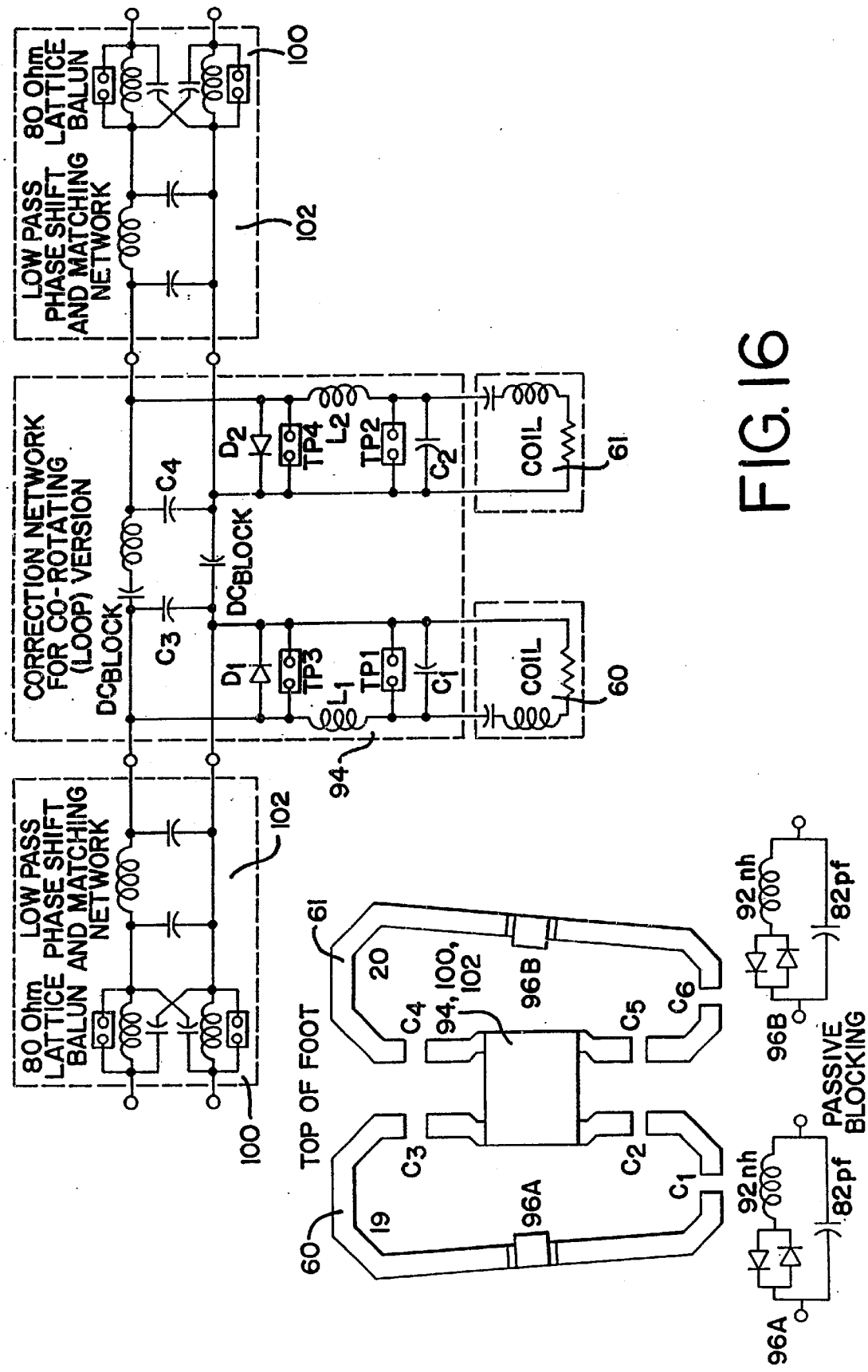

FIG. 16 is an electrical schematic diagram for surface coils 60 and 61. The surface coils 60 and 61 may be used in either bilateral or unilateral mode. A low-pass phase shift and matching network 102 couples each balun 100 to the network 94. Component values for the elements shown in FIG. 16 are as follows:

| Loop Components | Balun 100 | Low Pass Matching 102 |
|---|---|---|
| $C_1$ = 110 pf | C = 51 pf | C = 24 pf |
| $C_2$ = 91 pf | L = 142 nh | L = 258 nh |
| $C_3$ = 62 pf + 1–16 pf | | |
| $C_4$ = 62 pf + 1–16 pf | | |
| $C_5$ = 91 pf | | |
| $C_6$ = 110 pf | | |
| Network (Correction, Decoupling & Match) 94 | | |
| C1 = 180 pf | | |
| L1 = 45 nh | | |
| C2 = 180 pf | | |
| L2 = 45 nh | | |

-continued

| Loop Components | Balun 100 | Low Pass Matching 102 |
|---|---|---|
| C3 = 100 pf | | |
| C4 = 100 pf | | |
| L3 = 44 nh | | |
| Diodes = UM 9415 Diode | | |

As shown in FIGS. 11 through 16, the surface coil pairs in the lower leg portion of the peripheral vascular array 40 include an isolation network which operates to cancel the coupling due to mutual inductance. While the mutual inductance could have alternatively been reduced by overlapping the adjacent coils in the surface coil pairs (46,47), (48, 49), (50,51), (56, 57), (58, 59) and (60, 61), the use of the isolation network is preferable because it allows the loops in the coil pairs to be significantly smaller. As a consequence, the signal-to noise ratio is improved. In addition, by using smaller separated coils with an isolation network rather than overlapping larger coils, aliasing effects are reduced. Moreover, the isolation networks allow the surface coil pairs to operate as either a single loop (e.g. in an unilateral mode) or as combined counter-rotating and co-rotating pairs (e.g. in bilateral mode).

The surface coil array 10 described above may be connected to well known scanners to obtain a variety of images. The coils are typically connected to signal receivers in the scanners via preamplifier inputs. The number of signal receivers in a scanner is preferably kept small due to the cost of the signal receiver. For example, one known scanner uses four signal receivers which may receive signals from as many as eight preamplifier inputs. As discussed above, a preferred surface coil array 10 may contain as many as 20 coils 12. The coil interface 20 illustrated in FIG. 1 may be used to select groups of coils from the N surface array coils 12(1) through 12(N) to connect to the P preamplifier inputs to M signal receivers where N is greater than both M and P.

The coil interface 20 in FIG. 1 includes a switch 22 and a logic circuit 24 for controlling the state of the switch 22. The logic circuit 24 controls the state of the switch 22 according to configurations or groups of coils 12 that are combined to produce images targeting specific areas of the body. The configurations may be specified by signals at a coil select input 28 from the scanner 30 in response to user input. Alternatively, signals may be generated by other user-accessible sources, such as dip-switches or other suitable devices that may be connected to the interface by a cable, which may be electric or fiber optic. An infrared connection may also be used for remote control selection of coil groups.

Figure 17:
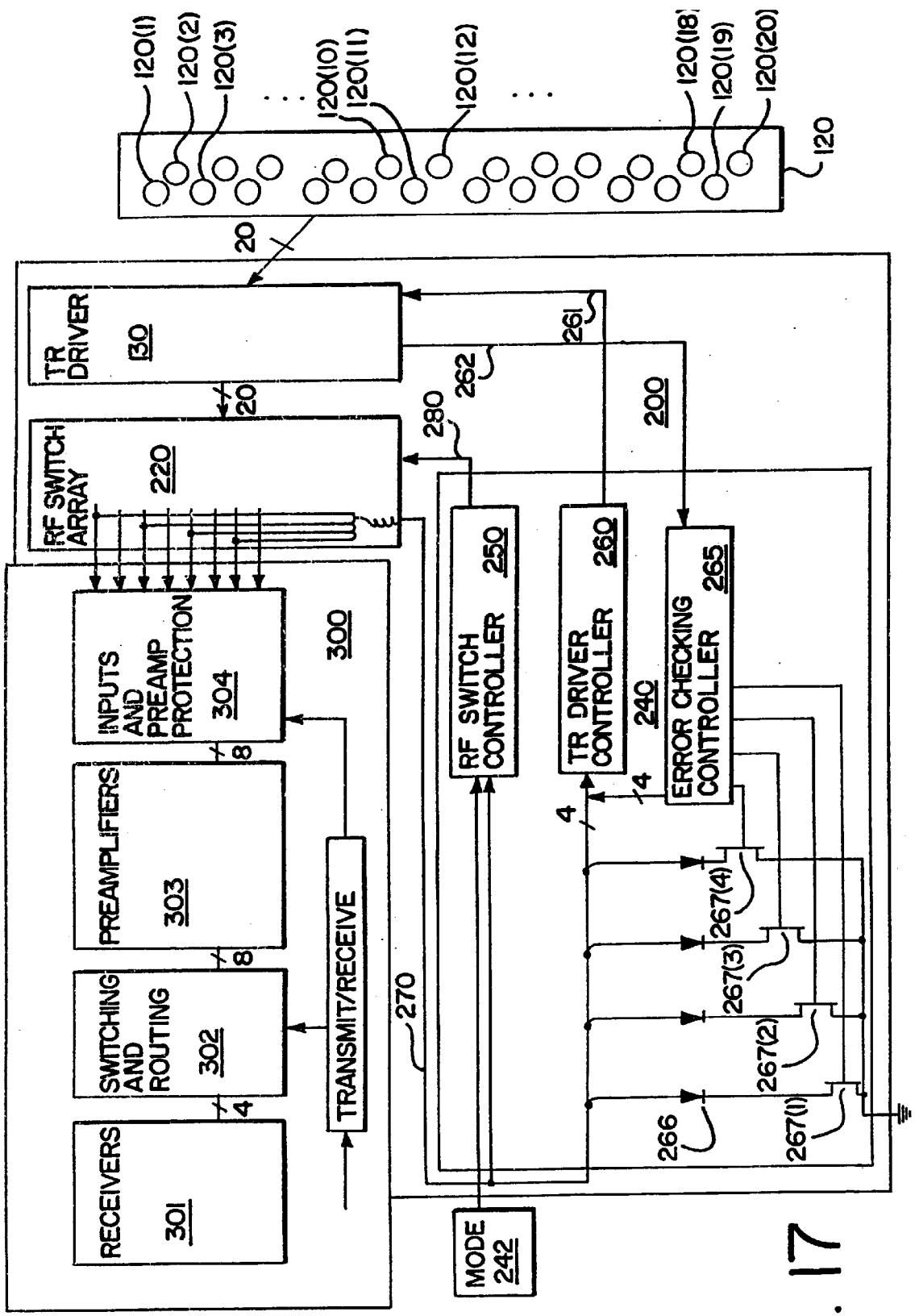
FIG. 17 is a block diagram of an NMR scanner and a 20-coil surface coil array that uses an interface in accordance with a preferred embodiment of the present invention.

FIG. 17 is a block diagram of a scanner 300 and a 20-coil surface coil array 120 that uses a coil interface 200 according to a preferred embodiment. The coil interface 200 in FIG. 17 includes a transmit/receive ("TR") driver 130, an RF switch array 220 and control logic 240, and interfaces the surface coil array 120 to the scanner 300 at a pre-amp array 303, which is internal to the scanner 300. The pre-amp array 303 connects to receivers 301 via a switching and routing circuit 302. The surface coil array 120 may, for example, be arranged in the form of the peripheral vascular array 40 described above with reference to FIG. 2A. The scanner 300 in a preferred embodiment is a Signa system with the phased array option from General Electric, as described above.

As shown in FIG. 17, the control logic circuitry 240 includes an RF switch controller 250, a TR driver controller 260 and error checking circuitry 265. The control logic circuitry 240 receives a coil select input 270 from the scanner 300 as the coil group selector input. The coil select signals at the coil select input are a four-bit digital word with DC voltage levels providing binary logic levels. The coil select input 270 may be coupled to the lines that connect to the coils themselves, and may thereafter, have some RF components. Inductors $L_{1-4}$ filter out any RF components so that a DC signal is received by the control logic circuitry 240.

The control logic circuitry 240 also receives a mode signal from a mode switch 242. The mode switch 242 allows a user to select a unilateral right, a unilateral left or a bilateral imaging mode. The modes are useful where right and left coils may be combined in the bilateral mode to obtain an image with a wider field of view, or isolated in the right or left modes to isolate a selected side. One advantage of isolating a selected side is that an improved signal to noise ratio is obtained thereby providing an image with a higher resolution.

The RF switch controller 250 uses the coil select input 270 and the mode signal from the switch 242 to select RF switch control lines 280. The selected RF switch control lines 280 enable RF switches in the RF switch array 220, which connect selected coils from the surface coil array 120, to couple image signals from the selected coils to the inputs 304 of the scanner 300.

The coil select input 270 is preferably coupled to the TR driver controller 260. The TR driver controller 260 uses the coil select input 270 to determine which coils are going to be used for imaging. The TR driver controller 260 outputs signals on the coil enable inputs 261 to enable the coils that are to be used for imaging and disable the remaining coils. The coil select input 270 advantageously permits the user to select different coil configurations without any scan room intervention.

The coil select input 270 may, for example, be a four-bit word generated by the scanner 300 when the user enters a request for images requiring a certain coil configuration. The user's request may be entered at a console (not shown). Alternatively, an input that is separate from the scanner 300 may be used. For example, a separate keypad may be used to input signals that designate a desired coil combination. Other inputs include, DIP switches, toggle switches, etc. To enter the request, the user may enter the four-bit word itself, a group identifier, a request for an image of a body part, or any other suitable input that the scanner 300 is programmed to understand as a group of coils or sequence of coil groups. The four-bit word in a preferred embodiment actually has the dual function of communicating a Transmit/Receive state to the coils as well as providing a group configuration input. When the scanner 300 generates a +5 v. signal on all coil select input lines 270, the scanner is in the Transmit state, in which case the remote coil is active and all of the receive coils (i.e. the coils in the surface coil array 120) are preferably actively disabled, such as by the PIN diode switches shown in FIGS. 5 through 16 for the peripheral vascular array 40, and not connected to the preamplifiers 303. When not all of the coil select input lines 270 are at +5 v., the coils connected to the preamplifiers 303 are selected in accordance with the four-bit word.

The logic control circuitry 240 includes an error checking controller 265 for sensing error conditions in the coils 120 or coil interface 200. The error checking controller receives error states from the TR driver 130 on error state lines 262, which are described below with reference to FIG. 19. The error checking controller 265 may also generate fault conditions on transistors 267(1)–267(4) to check for errors. Transistors 267(1)–267(4) are normally in a non-conducting state. When switched to a conducting state, the coil select input lines 270 may be put in an error checking mode by switching the states of the lines to a logic 0 or logic 1 to detect a specific fault. Conditions such as coil diode shorts, diode opens, DC power failure and TR driver failure may be sensed on lines 262 in response to the fault generated.

In a preferred coil interface 200, the 20 surface coils are grouped into groups of coils that produce specific, useful images. FIG. 2A illustrates the posterior and anterior coils 40 as COIL1 42, COIL2 43, COIL3 52, COIL4 53, COIL5 44, COIL6 54, COIL7 45, COIL8 55, COIL9 46, COIL10 47, COIL11 56, COIL12 57, COIL13 48, COIL14 49, COIL15 58, COIL16 59, COIL17 50, COIL18 51, COIL19 60 and COIL20 61. FIG. 18 is a coil group table 400 that describes groups of coils 402, a mode switch setting 404, coils selected for a group at 406, and comments 408 describing an image obtained by selecting the group of coils identified in each row of the table.

As shown in the coil group table 400, the Group 1 coils COIL1 42, COIL2 43, COIL3 52 and COIL4 53 are selected in order to obtain an image of vasculature from the renal arteries to the bifurcation. The function of the mode switch 242 (in FIG. 17) is illustrated by comparing Group 5 with Groups 8 and 10. In Group 5, the mode switch 242 is set to "Bilateral" as indicated in column 404. The coils selected in Group 5 are COIL13 48, COIL14 49, COIL15 58, COIL16 59, COIL17 50, COIL18 51, COIL19 60 and COIL20 61. The signals from these coils are combined in pairs as shown in FIG. 18 to provide an image of both the right and left feet By setting the mode switch 242 to "Right" (in FIG. 17) and selecting COIL13 48, COIL15 58, COIL17 50 and COIL19 60 as shown for Group 8, images of only the right foot and ankle are provided.

It is to be appreciated by one of ordinary skill in the art that FIGS. 2A and 18 illustrate one example of a configuration of surface coils that may be used with the coil interface of the present invention. With changes to the coil interface that are within the ability of one of ordinary skill in the art, any number of coils may be connected to a limited number of inputs according to functionally defined groups.

Referring to FIG. 17, the coil select input 270 is used by the TR driver controller 260 to enable coils that are to receive an image signal and to disable all other coils. The TR driver controller 260 determines which coils are to be used according to the group identified by the control select input 270. For each coil to be used, a coil enable signal is output on a corresponding coil enable input 261. The coil enable signal switches the TR driver 130 to the enable state, which permits current to flow through the PIN diode of the selected coil. The TR driver 130 maintains coils that do not receive a coil enable signal in a disabled state to prevent noise generated by coils from which an image signal is not desired. An advantage of enabling only coils that will receive image signals and disable all of the coils is that the signal to noise ratio is improved.

In a preferred embodiment, the TR driver 130 includes a coil driver 132 for each coil (COIL1, COIL2, COIL3, COIL4) in the surface coil array 120 as shown in FIG. 19. The coils 120(1)–120(4) are shown in FIG. 19 with the PIN diode used to drive the coil and enable an image RF signal to be input at the RF switch array 220. The coil drivers 132(a)–(d) are arranged in a totem-pole configuration 134 and supplied by a current source 136. In FIG. 19, only four coil drivers 132 are shown in a stack. Any number of coil drivers 132 may be connected in a stack. The number of coil drivers 132 in a stack is preferably the approximate maximum number of coils that can be simultaneously driven by the power supply.

Each coil driver 132 includes a differential switch 140(a) in which the gates of two FETs 142(a), 144(a) of opposite type are driven by the coil enable input 261(a). When the coil enable input 261(a) receives a coil disable signal (logic 1, −15 v.), the first FET 142(a) provides a current path 146 for current away from the coil 120(1). When the coil enable input 261(a) receives a coil enable signal (logic 0, 5 v.), the second FET 144(a) provides a current path 147 for current through the coil 120(1).

One advantage of using the totem pole configuration shown in FIG. 19 is that the number of coils that can be driven at one time is maximized. For example, if the PIN diodes in the coils are driven by a −10 v (−v=−10 v.) power supply that can provide up to 800 mA, the power supply may sag to about −8.5 due to wiring losses. Using the totem pole configuration, and assuming about a 0.9 v. drop per diode, 9 diodes may be simultaneously driven by the single current source 136. If each coil driver 132(a)–(d) and coil diode were to be driven by the power supply in parallel, four or fewer diodes may be driven simultaneously in parallel. Although power supplies may vary according to the type of NMR scanner used, the advantages offered by the totem pole configuration, particularly that of maximizing the number of coil drivers, are still available.

Another advantage of the totem pole configuration is that error-checking functions may be incorporated into the coil interface by sensing the state of the voltage levels at selected points in the coil drivers 132(a)–(d). In a preferred embodiment, at least four error conditions may be sensed: coil diode open, coil diode short, transistor (FET) open, transistor (FET) short.

The error conditions in a preferred embodiment may be sensed by generating fault conditions as described above with reference to FIG. 17, and by using an upper error switch 145(a)(1) and a lower error switch 145(a)(2) each having digital outputs to the logic circuit 262(a)(1) and 262(a)(2), respectively. The FET transistor 142(a) and FET transistor 144(a) must be in opposite states at all times. If outputs 262(a)(1) and 262(s)(2) of the upper and lower error switches 145(a)(1), 145(a)(2) are in the same state, a diode open or a diode short is sensed.

For example, if coil enable input 261(a) has an enable signal, the FET transistor 144(a) is in the 'ON' state thereby providing current to the diode in COIL1; and the FET transistor 142(a) is in the 'OFF' state. When the FET transistor 144(a) is 'ON', the lower error switch 145(a)(2) is 'ON' and when the FET transistor 142(a) is 'OFF', the upper error switch 145(a)(2) is 'OFF'. If the coil PIN diode for COIL1 is open, the lower error switch 145(a)(2) will remain in the 'OFF' state even when an enable signal (5 v) is received. Both 262(a)(1) and 262(a)(2) outputs will be sensed in the low state by the logic circuit 240. In a preferred embodiment, the scanning will be aborted when an error is detected.

A window comparator 151 is used in a preferred embodiment to detect transistor open or transistor short conditions when outputs $Q_0$ and $Q_1$ are in opposite states and therefore appear normal. If a transistor (such as 142(a), 144(a), etc.) is open, not enough current is being drawn through $R_{error}$ (2.8 ohms). The window comparator 151 will detect a voltage at 153 that is greater than $V_{ul}$. If a transistor is shorted, too much current will be detected by the window comparator when the voltage at 153 is lower than $V_{ll}$.

Figure 20:
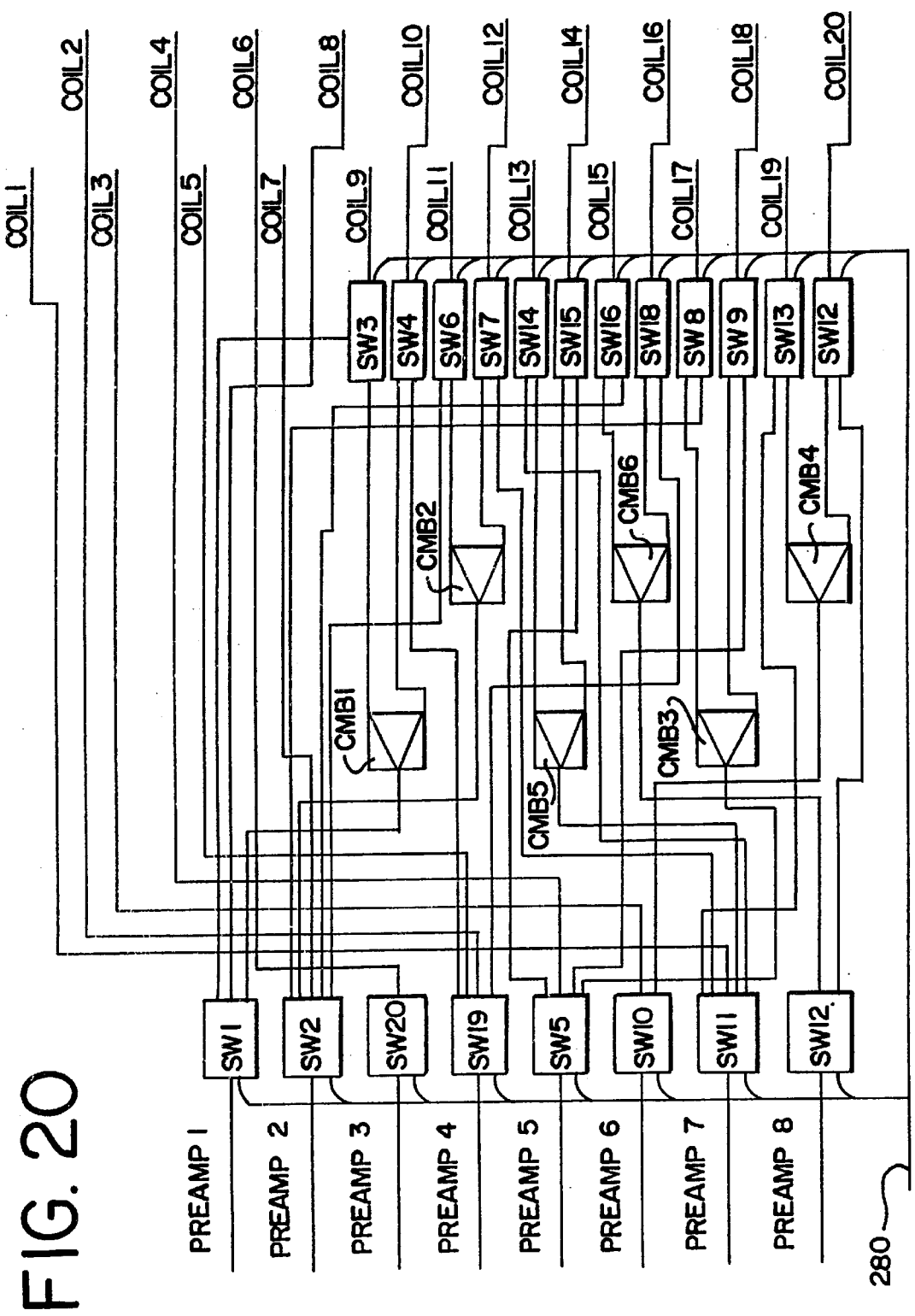
FIG. 20 is an electrical schematic of the RF switch array shown in FIG. 17.

The groups in the coil group table 400 in FIG. 18 may be selected using the RF switch array 220 in FIG. 17. FIG. 20 shows an implementation of the RF switch array 220. The RF switch array 220 in FIG. 20 includes RF switches SW1–SW20 and RF combiners CMB1–CMB6 connected in the configuration shown. The RF switches SW1–SW20 are enabled by control inputs 280. Control inputs 280 each include one or more control lines that are controlled by the logic circuit 240 as described below with reference to FIGS. 23A and 23B.

The configuration of RF switches SW1–SW20 and combiners CMB1–CMB6 determines the surface coils to be selected for input of the image signal according to the groups selected from the coil selection input 270 and mode switch 242 (in FIG. 17). The RF switches SW1–SW20 may include the switches illustrated in FIGS. 21A–21C, as well as variations of the switches in FIGS. 21A–21C.

Figure 21C:
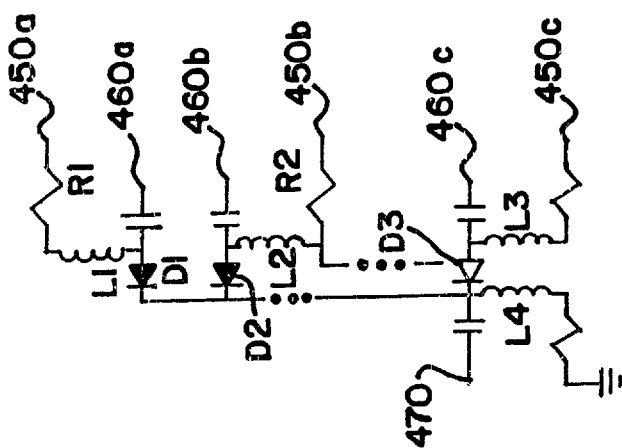
FIGS. 21A through 21C are electrical schematics of the RF switches shown in FIG. 20.
Figure 21B:
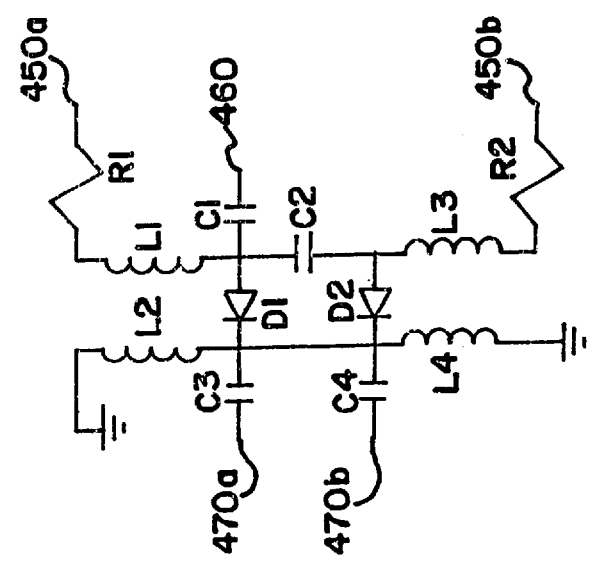
Figure 21A:
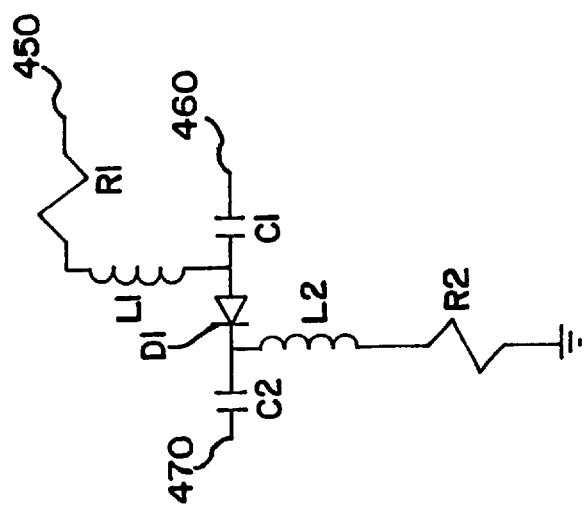

The switches in FIGS. 21A–21C use PIN diodes as the preferred switching element. PIN diodes are fast, non-magnetic switches that may have a resistance on the order of a few ohms in the 'on' state.

FIG. 21A illustrates a single RF switch having one control input 450 controlling a single PIN diode D1. The RF switch input 460 is coupled to a coil with an RF imaging signal that may include a DC voltage. When the control input 450 is set to a voltage that is sufficiently positive to forward bias the PIN diode D1, the diode D1 switches to a conducting state and behaves like a resistor. The diode D1 conducts the RF imaging signal at the input through capacitors C1 and C2, which block any DC components, to RF switch output 470. The inductors L1 and L2 filter out the RF signal from the control input 450 and from ground allowing the signal to be coupled to the output 470.

FIG. 21B illustrates an RF switch having a single input 460 that can switch to either of two outputs 470a and 470b. The RF signal coupled to RF switch input 460 is output to output 470a when control input 450a forward biases diode D1 and to output 470b when control output 450b forward biases diode D2. In one variation of the switch in FIG. 20B, multiple PIN Diodes D1, D2 may share the same control input 450.

FIG. 21C illustrates an RF switch having multiple inputs and a single output. Each input 460a, 460b, 460c couples to a respective diode D1, D2, D3. The diodes D1, D2, D3 are connected to a common output 470. When the control input 450a, 450b, or 450c corresponding to the diode D1, D2 or D3 forward biases the diode, the signal at the input is coupled to the RF output 470. Multiple PIN Diodes D1, D2 may share the same control input 450.

Figure 22A:
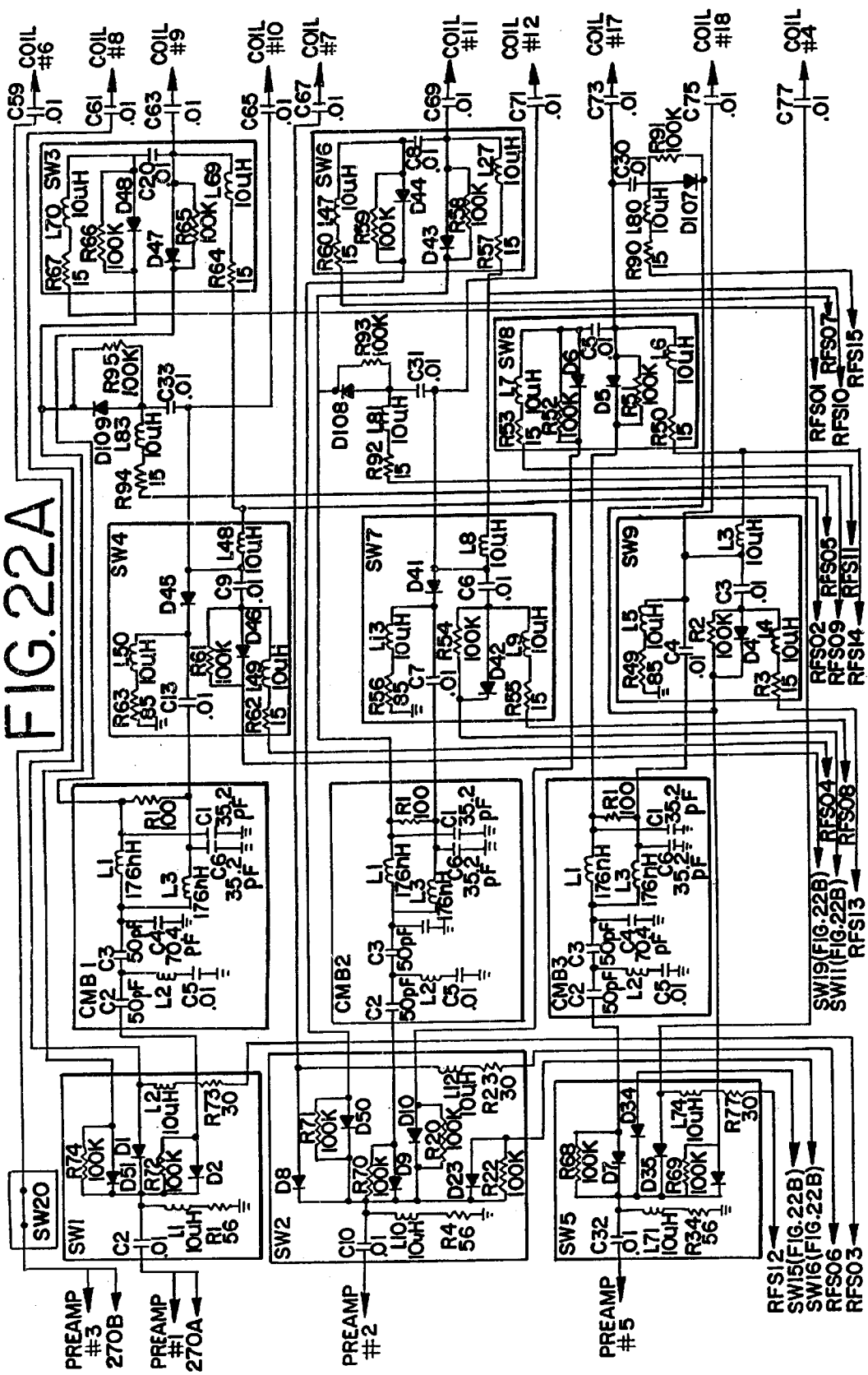

FIGS. 22A–22B are schematic representations of RF switch array 220 illustrating the components in RF switches SWI-SW20 and combiners CMB1–CMB6. RF switches SW1, SW2 and SW5 are shown with RF switch control inputs 450, RF switch inputs 460 and RF switch outputs 470 labeled according to the conventions in FIGS. 21A–21C. The RF control inputs 450 for each switch interface to the RFS1–RFS33 lines on ports P2 and P4. Ports P2 and P4 in a preferred embodiment interface to the control logic 240 which includes circuitry for selecting coils.

FIGS. 22A and 22B illustrate the control of RF switches by selectively enabling RFS1–RFS33. For example, if the coil select input designates a coil group, the RF switch controller 250 determines which RF switch or switcher are to be enabled. The coil enable signal (i.e. logic or +5V in a preferred embodiment) is output by the RF switch controller 266 in the control logic circuitry 240 on RFS03. The 5V signal forward biases diode D1. With Diode D1 forward biased, the RF signal at coil 8 is output by SW1 at RF switch output 470.

As shown in FIG. 22A, the output 470 of switch SW1 is coupled to bit A of the coil select input 270. Capacitor C2 blocks the DC voltage signal applied to the output 470 when the coil select input 270 selects a coil group. By blocking DC signals capacitor C2 permits Diode D1 to be forward biased.

The combiners CMB1–CMB6 are typical RF signal combiners such as Wilkerson combiners that are used to combine RF imaging signals from two separate coils. For example, Groups 4 and 5 in FIG. 18 use signals that are a combination of RF imaging signals from different coils.

The preamplifiers 303 in the scanner 300 are generally sensitive to source impedance, which in FIG. 17, for example, is dependent upon the RF electrical characteristics of the coil interface 200 and the surface coil array 120. This sensitivity is typically quantified in terms of the noise figure of the preamplifiers 303.

In accordance with a preferred embodiment of the present invention, the RF design of the coil interface 200 and the surface coil array 120 minimizes the effect of this sensitivity by presenting the preamplifiers 303 with substantially the same source impedance, regardless of the mode of operation (left, right or bilateral) of surface coil array 120. This may be accomplished by setting the electrical length of the entire transmission path from the surface coil to the preamplifier 303 to be equal to an odd multiple of quarter-wavelengths. Since the combiners CMB1–CMB6 in the RF switch 220 are in the transmission path for bilateral imaging and out of the transmission path for unilateral imaging, the bilateral imaging transmission path includes additional phase delay from the combiners CMB1–CMB6, which may be compensated for by using a phase advance T network, in series with the combiners CMB1–CMB6. In a similar manner, a π network may be used to adjust the electrical length of the unilateral imaging transmission path. The implementations of T and π phase-shifting networks are well known to those skilled in the art.

Figure 23B:
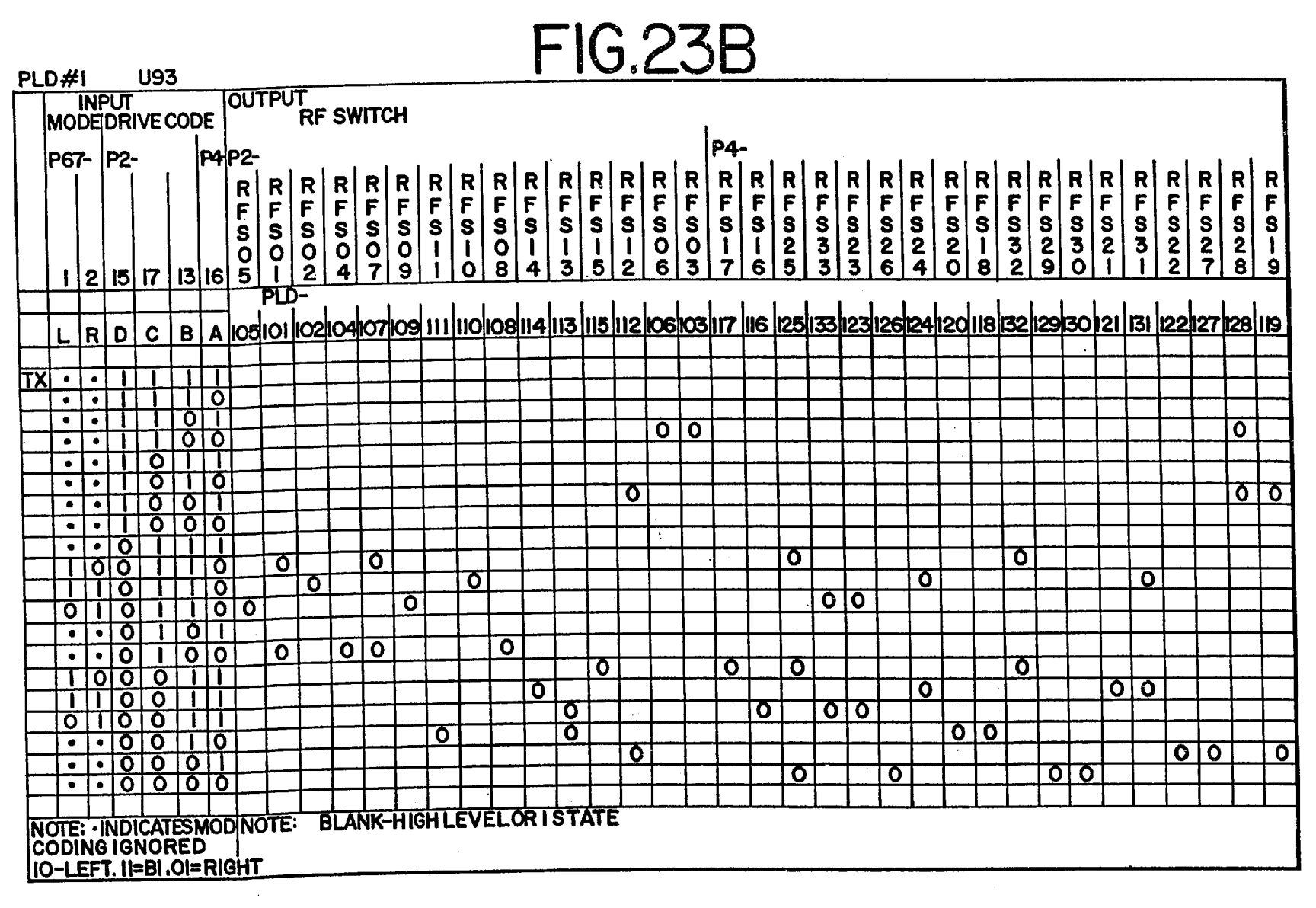

The selection of coils for the input of RF imaging signals is accomplished by the control logic 240 which uses the coil select input 270 and mode select switch 242 (in FIG. 17) to output control signals on the RFS1–RFS33 lines 280. FIG. 23A illustrates a programmable logic device (PLD) U93 used to output control signals RFS1–RFS33 in response to the coil select input 270 and mode switch 242. The PLD U93 outputs control signals at outputs PLD101–PLD133. FIG. 23B is a table that illustrates the RFSxx signal that corresponds to the PLDxxx signals in FIG. 23A. FIG. 23B also illustrates the states of coil select input 270 and the states of mode select switch 242. The states of the RSFxx lines at 280 corresponding to the states of the coil select input 270 and mode select switch 242 are also provided in FIG. 23B. A state of '0' for RSFxx indicates that the corresponding switch is enabled. The logical '0' in a preferred embodiment is set at 5 v. while the logical '1' is set at –15 v. The state of '0' therefore forward biases the PIN diode at the control input of the switch corresponding to the specified RSFxx line.

Figure 23C:
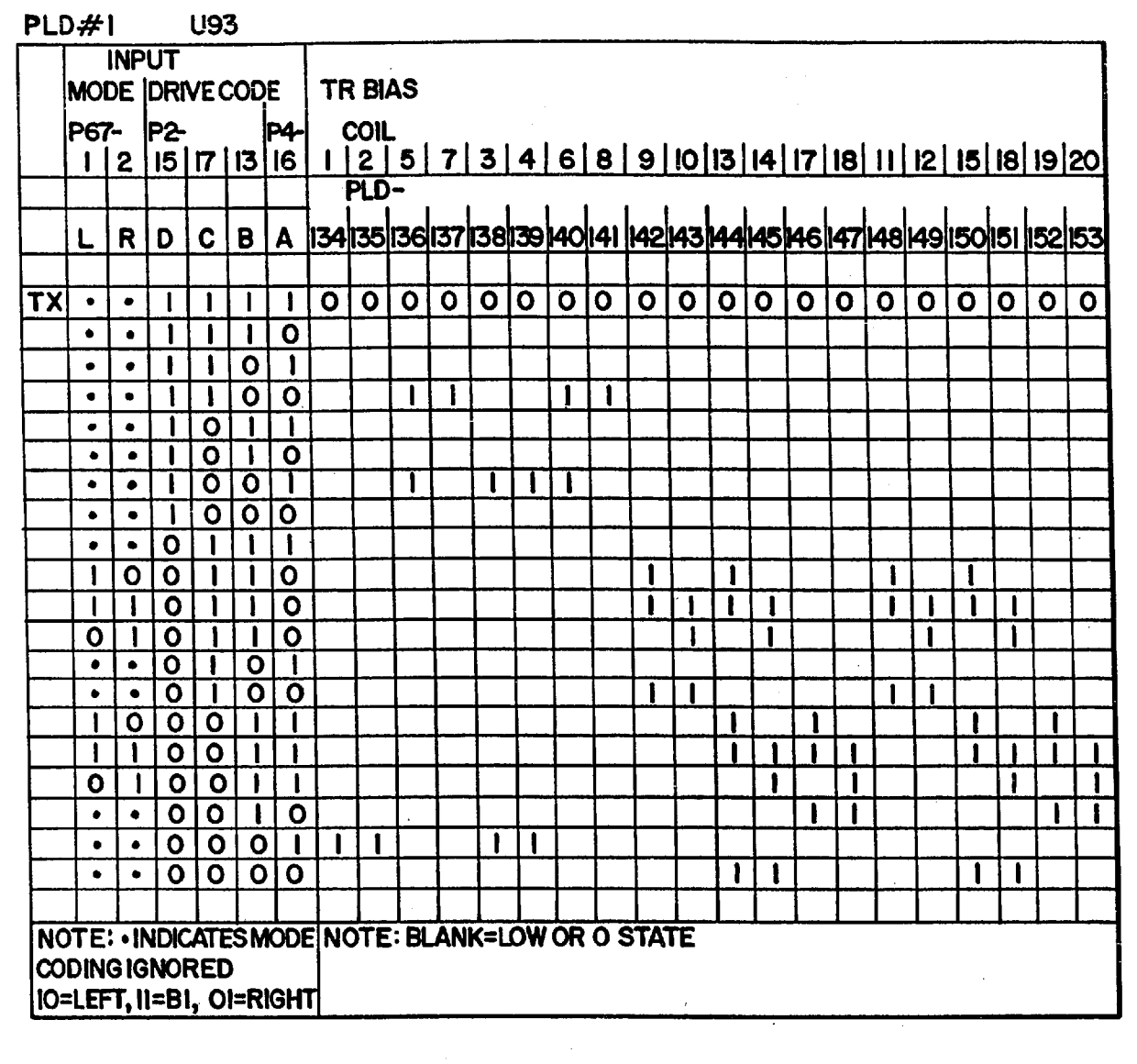

FIG. 23C shows the states of the coil enable inputs 261 according to the coil select input 270 and mode switch 242. FIG. 23C illustrates the coils selected for various states of the coil select input 270 and the mode select switch 242. By referring to FIGS. 23B and 23C, one of ordinary skill in the art can determine the combinations of RF switches SW1–SW20 and coil enable inputs 261 used to select coils for the desired coil groups.

In accordance with a preferred method for imaging the peripheral vasculature with the peripheral vascular array 40, a combination of contrast study and time-of-flight imaging is utilized. Generally speaking, the use of a contrast agent, such as Gadolinium, will improve image quality and reduce inspection times. Such contrast agents are, however, relatively expensive and the imaging of the entire peripheral vasculature would require a substantial amount of the contrast agent. The method therefore utilizes a contrast agent for imaging only those areas where time-of-flight imaging is difficult.

In particular, the method includes the step of performing a contrast study of the renal arteries and the abdominal bifurcation by acquiring image information using surface coils 42, 43, 52 and 53. The timing of image acquisition is coordinated with the injection of the contrast agent in any known manner. Time-of-flight imaging is then utilized to acquire image information from the vasculature in the legs, using, for example, surface coils 44 through 49 and 54 through 59. Images of the feet may be obtained using either the contrast study or the time-of-flight technique by acquiring image information from surface coils 50, 51, 60 and 61.

In the alternative, images of the peripheral vasculature may be obtained using the peripheral vascular array 40 with only time-of-flight imaging. This technique, however, may require longer examination times due to the difficulty of using time-of-flight imaging to acquire image information in structures having sagittal plane blood flow, such as the renal arteries.

In accordance with another preferred method, the peripheral vascular array 40 acquires successive adjacent axial images in timed relation to the progression of a bolus of contrast agent through the peripheral vasculature. This is made possible by the large area covered by the peripheral vascular array 40, which allows images from the renal arteries through the feet to be obtained without repositioning the array 40.

While the invention has been described in conjunction with presently preferred embodiments of the invention, persons of ordinary skill in the art will appreciate that variations may be made without departure from the scope and spirit of the invention. The true scope and spirit of the invention is defined by the appended claims, interpreted in light of the foregoing description.

We claim:

1. A circuit for selectively enabling and disabling n-coils, said circuit comprising:

(a) n-drivers powered by a current source, each of said n-drivers having an N-channel FET and a P-channel FET disposed such that a gate of said N-channel FET is connected to a gate of said P-channel FET to form a common gate node thereat, said n-drivers disposed in a totem-pole configuration such that:

(i) said N-channel FET of a first of said n-drivers has (A) a drain thereof linked to a ground and to an end of a first of said n-coils and (B) a source thereof linked to a drain of said N-channel FET of a second of said n-drivers and to an end of a second of said n-coils;

(ii) said P-channel FET of said first of said n-drivers has (A) a source thereof linked to an opposite end of said first of said n-coils and (B) a drain thereof linked to said end of said second of said n-coils and to said source of said N-channel FET of said first of said n-drivers;

(iii) said N-channel FET of said second of said n-drivers also having (A) a source thereof linked to a drain of said N-channel FET of a next of said n-drivers and to an end of a next of said n-coils, said P-channel FET of said second of said n-drivers also having (A) a source thereof linked to an opposite end of said second of said n-coils and (B) a drain thereof linked to said end of said next of said n-coils and to said source of said N-channel FET of said second of said n-drivers; and (iv) continuing until said N-channel FET and said P-channel FET of an nth of said n-drivers are likewise disposed in said totem-pole configuration of said n-drivers with a source and a drain of said N-channel FET and said P-channel FET, respectively, of said nth of said n-drivers being connected to said current source; and (b) each of said n-drivers for operating a corresponding one of said n-coils by being responsive at said common gate node therefor to (i) a coil disable signal by activating said N-channel FET thereof and deactivating said P-channel FET thereof thereby not only drawing current away from and thus disabling said corresponding coil but also allowing said current to flow through said N-channel FET and thus be available as a source of current to a successive one of said n-drivers and (ii) a coil enable signal by deactivating said N-channel FET thereof and activating said P-channel FET thereof thereby allowing said current not only to flow serially through said corresponding coil and said P-channel FET thus enabling said corresponding coil but also to be available as a source of current to said successive one of said n-drivers.

2. The circuit of claim 1 further comprising:

(a) a PIN diode within each of said n-coils, each of said PIN diodes capable of being biased to actively decouple said coil corresponding thereto from a radio frequency field generated during a transmit cycle of a magnetic resonance imaging (MRI) system; and (b) a diode connected serially with said N-channel FET corresponding thereto;

so that for each of said n-drivers a voltage drop and a current flow therethrough is substantially equal whether said current is flowing through (i) said P-channel FET and said corresponding coil or (ii) said N-channel FET.

3. The circuit of claim 2 wherein each of said n-drivers further comprises an upper error state switch and a lower error state switch for sensing at least one of (i) when said PIN diode corresponding thereto is opened, (ii) when said PIN diode corresponding thereto is shorted, (iii) when either of said N-channel FET or said P-channel FET corresponding thereto is opened, and (iv) when either of said N-channel FET or said P-channel FET corresponding thereto is shorted.

4. The circuit of claim 3 wherein in each of said n-drivers said upper error state switch is connected to said drain of said N-channel FET thereof and said lower error state switch is connected to said source of said P-channel FET thereof.

5. The circuit of claim 1 further comprising a comparator for monitoring said current through said n-drivers and detecting (i) a short condition when said current flowing therethrough is higher than an upper predetermined level and (ii) an open condition when said current flowing therethrough is lower than a lower predetermined level.

6. A circuit for selectively enabling and disabling n-coils, said circuit comprising:

(a) n-drivers powered by a current source, each of said n-drivers having a pair of FETs disposed such that a gate of one of said FETs is connected to a gate of an other of said FETs to form a common gate node thereat, said n-drivers disposed in a totem-pole configuration such that:

(i) said one FET of a first of said n-drivers has (A) a drain thereof linked to a ground and to an end of a first of said n-coils and (B) a source thereof linked to a drain of said one FET of a second of said n-drivers and to an end of a second of said n-coils;

(ii) said other FET of said first of said n-drivers has (A) a source thereof linked to an opposite end of said first of said n-coils and (B) a drain thereof linked to said end of said second of said n-coils and to said source of said one FET of said first of said n-drivers;

(iii) said one FET of said second of said n-drivers also having (A) a source thereof linked to a drain of said one FET of a next of said n-drivers and to an end of a next of said n-coils, said other FET of said second of said n-drivers also having (A) a source thereof linked to an opposite end of said second of said n-coils and (B) a drain thereof linked to said end of said next of said n-coils and to said source of said one FET of said second of said n-drivers; and (iv) continuing until said one FET and said other FET of an nth of said n-drivers are likewise disposed in said totem-pole configuration of said n-drivers with a source and a drain of said one FET and said other FET, respectively, of said nth of said n-drivers being connected to said current source; and (b) each of said n-drivers for operating a corresponding one of said n-coils by being responsive at said common gate node therefor to (i) a coil disable signal by activating said one FET thereof and deactivating said other FET thereof thereby not only drawing current away from and thus disabling said corresponding coil but also allowing said current to flow through said one FET and thus be available as a source of current to a successive one of said n-drivers and (ii) a coil enable signal by deactivating said one FET thereof and activating said other FET thereof thereby allowing said current not only to flow serially through said corresponding coil and said other FET thus enabling said corresponding coil but also to be available as a source of current to said successive one of said n-drivers.

7. The circuit of claim 6 further comprising:

(a) a PIN diode within each of said n-coils, each of said PIN diodes capable of being biased actively decouple said coil corresponding thereto from a radio frequency field generated during a transmit cycle of a magnetic resonance imaging (MRI) system; and (b) a diode connected serially with said one FET corresponding thereto;

so that for each of said n-drivers a voltage drop and a current flow therethrough is substantially equal whether said current is flowing through (i) said other FET and said corresponding coil or (ii) said one FET.

8. The circuit of claim 7 wherein each of said n-drivers further comprises an upper error state switch and a lower error state switch for sensing at least one of (i) when said PIN diode corresponding thereto is opened, (ii) when said PIN diode corresponding thereto is shorted, (iii) when either of said one FET or said other FET corresponding thereto is opened, and (iv) when either of said one FET or said other FET corresponding thereto is shorted.

9. The circuit of claim 8 wherein in each of said n-drivers said upper error state switch is connected to said drain of said one FET thereof and said lower error state switch is connected to said source of said other FET thereof.

10. The circuit of claim 6 further comprising a comparator for monitoring said current through said n-drivers and detecting (i) a short condition when said current flowing therethrough is higher than an upper predetermined level and (ii) an open condition when said current flowing therethrough is lower than a lower predetermined level.

11. A circuit for selectively enabling and disabling n-coils of an array of imaging coils for use with a magnetic resonance imaging (MRI) system, said circuit comprising:

(a) a relatively positive power source;

(b) a relatively negative power source;

(c) n-drivers for driving said n-coils of said array, each of said n-drivers having a pair of FETs disposed such that a gate of one of said FETs is connected to a gate of an other of said FETs to form a common gate node thereat, said n-drivers disposed in a totem-pole configuration such that:

(i) said one FET of a first of said n-drivers has (A) a drain linked to said relatively positive power source and to an end of a first of said n-coils and (B) a source linked to a drain of said one FET of a second of said n-drivers and to an end of a second of said n-coils;

(ii) said other FET of said first of said n-drivers has (A) a source linked to an opposite end of said first of said n-coils and (B) a drain linked to said end of said second of said n-coils and to said source of said one FET of said first of said n-drivers;

(iii) said one FET of said second of said n-drivers also having (A) a source linked to a drain of said one FET of a next of said n-drivers and to an end of a next of said n-coils, said other FET of said second of said n-drivers also having (A) a source linked to an opposite end of said second of said n-coils and (B) a drain linked to said end of said next of said n-coils and to said source of said one FET of said second of said n-drivers; and (iv) continuing until said one FET and said other FET of an nth of said n-drivers are likewise disposed in said totem-pole configuration of said n-drivers with a source and a drain of said one FET and said other FET, respectively, of said nth of said n-drivers being connected to said relatively negative power source; and (d) each of said n-drivers for operating a corresponding one of said n-coils by being responsive at said common gate node therefor to (i) a coil disable signal by activating said one FET thereof and deactivating said other FET thereof thereby not only drawing current away from and thus disabling said corresponding coil but also allowing said current to flow through said one FET and thus be available as a source of current to a successive one of said n-drivers and (ii) a coil enable signal by deactivating said one FET thereof and activating said other FET thereof thereby allowing said current not only to flow through said corresponding coil and said other FET thus enabling said corresponding coil but also to be available as a source of current to said successive one of said n-drivers.

12. The circuit of claim 10 further comprising:

(a) a PIN diode within each of said n-coils, each of said PIN diodes capable of being biased to actively decouple said coil corresponding thereto from a radio frequency field generated during a transmit cycle of a magnetic resonance imaging (MRI) system; and (b) a diode connected serially with said one FET corresponding thereto;

so that for each of said n-drivers a voltage drop and a current flow therethrough is substantially equal whether said current is flowing through (i) said other FET and said corresponding coil or (ii) said one FET.

13. The circuit of claim 12 wherein each of said n-drivers further comprises an upper error state switch and a lower error state switch for sensing at least one of (i) when said PIN diode corresponding thereto is opened, (ii) when said PIN diode corresponding thereto is shorted, (iii) when either of said one FET or said other PET corresponding thereto is opened, and (iv) when either of said one FET or said other PET corresponding thereto is shorted.

14. The circuit of claim 13 wherein in each of said n-drivers said upper error state switch is connected to said drain of said one FET thereof and said lower error state switch is connected to said source of said other FET thereof.

15. The circuit of claim 11 further comprising a comparator for monitoring said current through said n-drivers and detecting (i) a short condition when said current flowing therethrough is higher than an upper predetermined level and (ii) an open condition when said current flowing therethrough is lower than a lower predetermined level.

16. A circuit for selectively enabling and disabling n-coils, said circuit comprising:

(a) n-drivers disposed in a totem-pole configuration and powered by a current source, each of said n-drivers having a current source connection and a current sink connection such that (i) a first of said n-drivers is linked via said current source connection therefor to said current source, (ii) a next of said n-drivers is linked via said current source connection therefor and said current sink connection of said first of said n-drivers to said current source, and (iii) continuing until an nth of said n-drivers is linked via said current source connection therefor and said current sink connection of an (n−1)th of said n-drivers to said current source; and (b) each of said n-drivers for operating a corresponding one of said n-coils by being responsive to (i) a coil enable signal by providing current to said coil corresponding thereto via said current source connection therefor thereby enabling said coil corresponding thereto and (ii) a coil disable signal by drawing current away from said coil corresponding thereto via said current sink connection therefor thereby disabling said coil corresponding thereto.

* * * * *